(12) United States Patent
Fujiwara et al.

(10) Patent No.: US 7,129,550 B2
(45) Date of Patent: Oct. 31, 2006

(54) FIN-SHAPED SEMICONDUCTOR DEVICE

(75) Inventors: Makoto Fujiwara, Yokohama (JP);
Kazunari Ishimaru, Yokohama (JP);
Akira Hokazono, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/775,017

(22) Filed: Feb. 9, 2004

(65) Prior Publication Data

US 2005/0051825 A1 Mar. 10, 2005

(30) Foreign Application Priority Data

Sep. 9, 2003 (JP) .............................. 2003-317259

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ...................... 257/401; 257/336; 257/344; 257/408; 257/618; 257/619; 257/623

(58) Field of Classification Search ........ 257/618–619, 257/623, 336, 344, 401, 408
See application file for complete search history.

(56) References Cited

U.S. PATENT DOCUMENTS

| | | | |
|---|---|---|---|
| 6,245,615 B1 | 6/2001 | Noble et al. ................. | 438/270 |
| 6,252,284 B1 | 6/2001 | Muller et al. ............... | 257/412 |
| 6,316,813 B1 | 11/2001 | Ohmi et al. ................. | 257/401 |
| 6,413,802 B1* | 7/2002 | Hu et al. ..................... | 438/151 |
| 6,525,403 B1* | 2/2003 | Inaba et al. ................. | 257/618 |
| 6,838,322 B1* | 1/2005 | Pham et al. ................. | 438/151 |
| 6,849,884 B1* | 2/2005 | Clark et al. ................. | 257/192 |
| 6,888,181 B1* | 5/2005 | Liao et al. ................... | 257/192 |
| 2003/0178670 A1* | 9/2003 | Fried et al. ................. | 257/315 |
| 2004/0026736 A1* | 2/2004 | Grupp et al. ............... | 257/330 |
| 2004/0061191 A1* | 4/2004 | Paton et al. ................ | 257/412 |
| 2004/0110331 A1* | 6/2004 | Yeo et al. .................... | 438/199 |
| 2004/0203211 A1* | 10/2004 | Yang et al. ................. | 438/299 |
| 2004/0217420 A1* | 11/2004 | Yeo et al. .................... | 257/347 |
| 2004/0219722 A1* | 11/2004 | Pham et al. ................ | 438/157 |
| 2004/0222477 A1* | 11/2004 | Aller et al. ................. | 257/412 |
| 2004/0235300 A1* | 11/2004 | Mathew et al. ............. | 438/689 |
| 2004/0256647 A1* | 12/2004 | Lee et al. .................... | 257/289 |
| 2004/0262688 A1* | 12/2004 | Nowak et al. .............. | 257/350 |
| 2005/0023633 A1* | 2/2005 | Yeo et al. .................... | 257/500 |
| 2005/0093154 A1* | 5/2005 | Kottantharayil et al. .... | 257/745 |

* cited by examiner

*Primary Examiner*—Ida M. Soward
(74) *Attorney, Agent, or Firm*—Frommer Lawrence & Haug LLP

(57) ABSTRACT

A semiconductor layer in which a primary part of a FinFET is formed, i.e., a fin has a shape which is long in a direction x and short in a direction y. A width of the fin in the direction y changes on three stages. First, in a channel area between gate electrodes each having a gate length Lg, the width of the fin in the direction y is Wch. Further, the width of the fin in the direction y in a source/drain extension area adjacent to the channel area in the direction x is Wext (>Wch). Furthermore, the width of the fin in the direction y in a source/drain area adjacent to the source/drain extension area in the direction x is Wsd (>Wext).

20 Claims, 28 Drawing Sheets

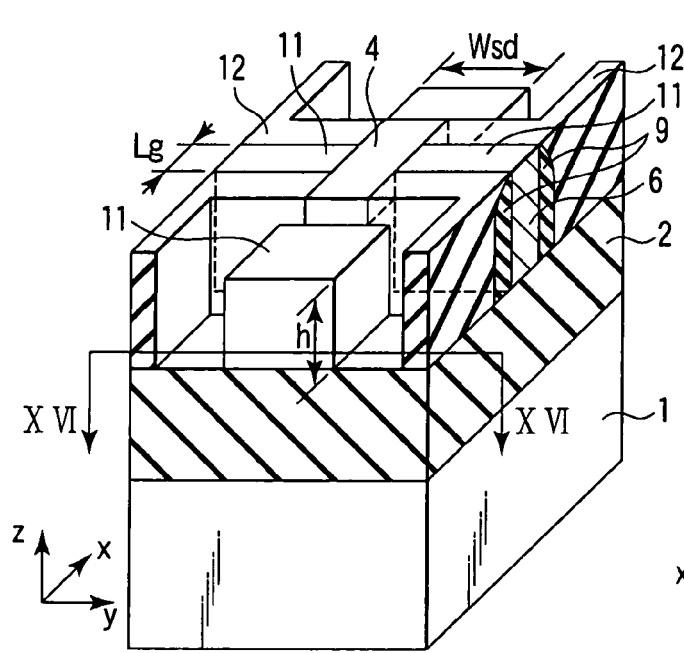
F I G. 15
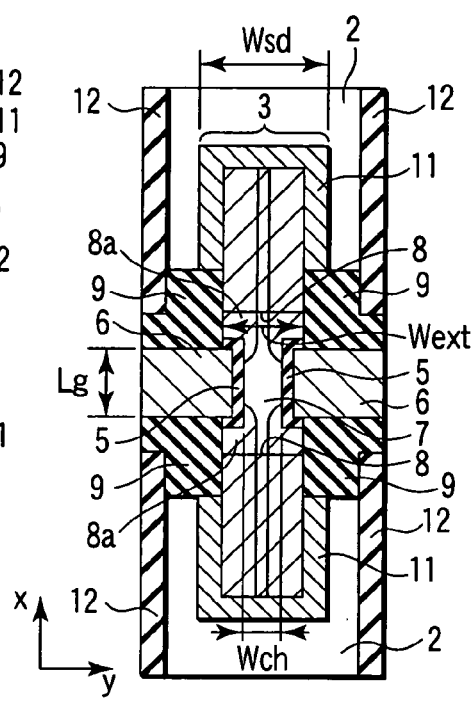
F I G. 16
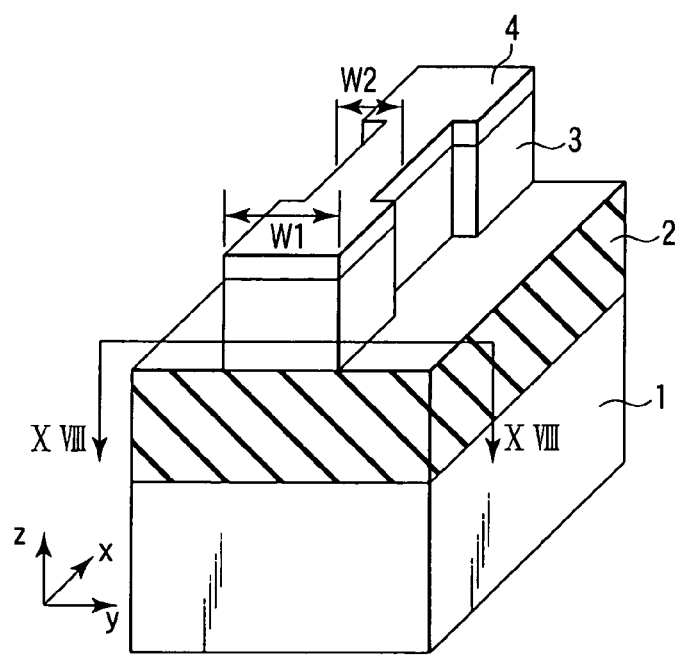
F I G. 17
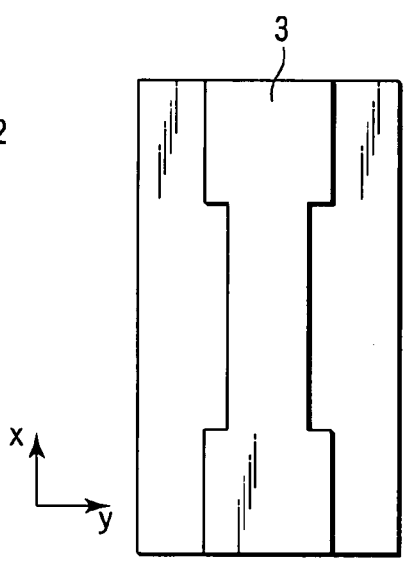
F I G. 18

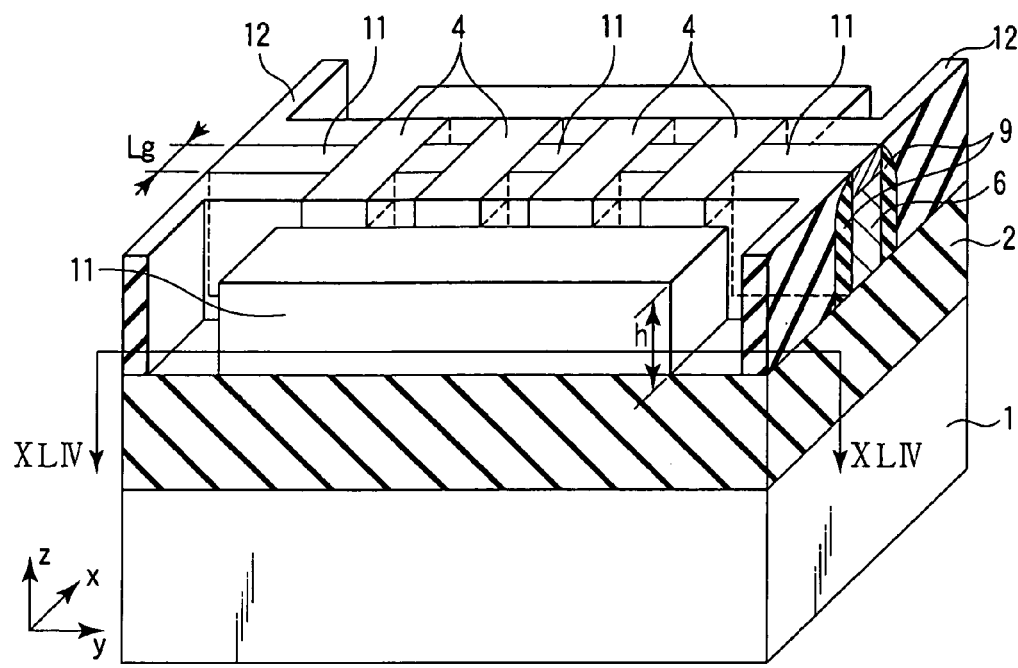
F I G. 43
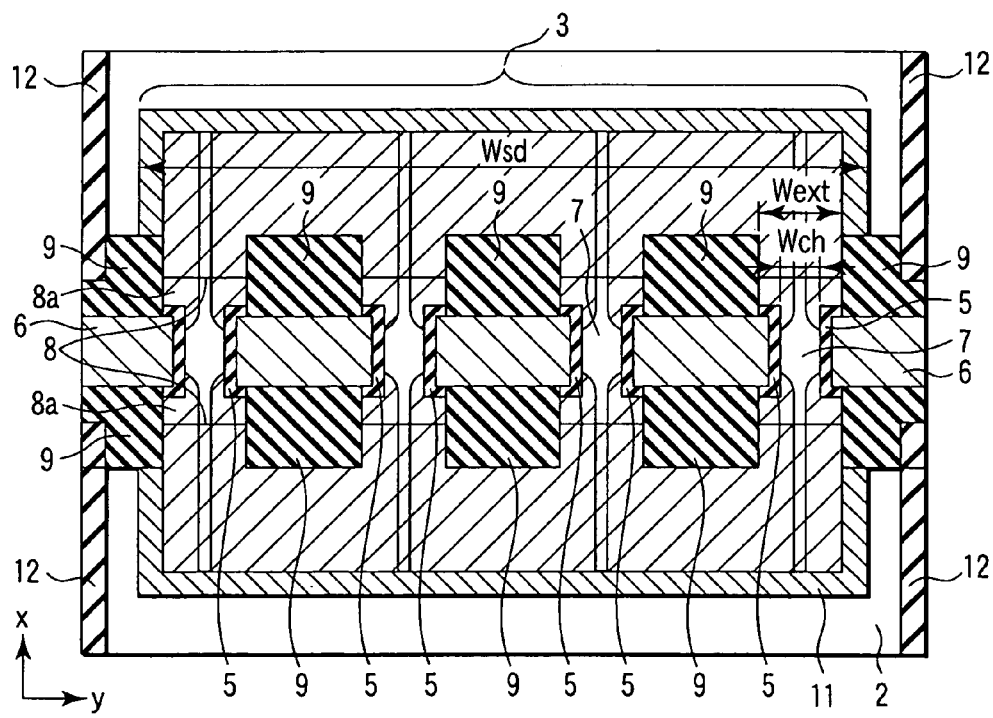
F I G. 44

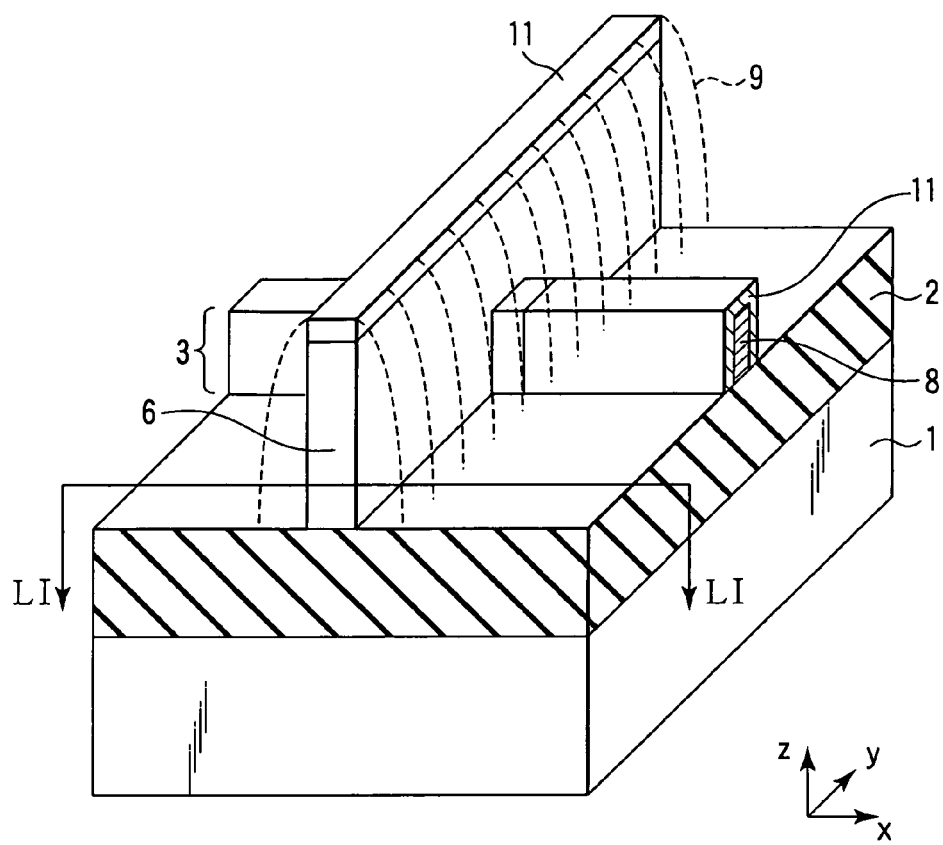
F I G. 50
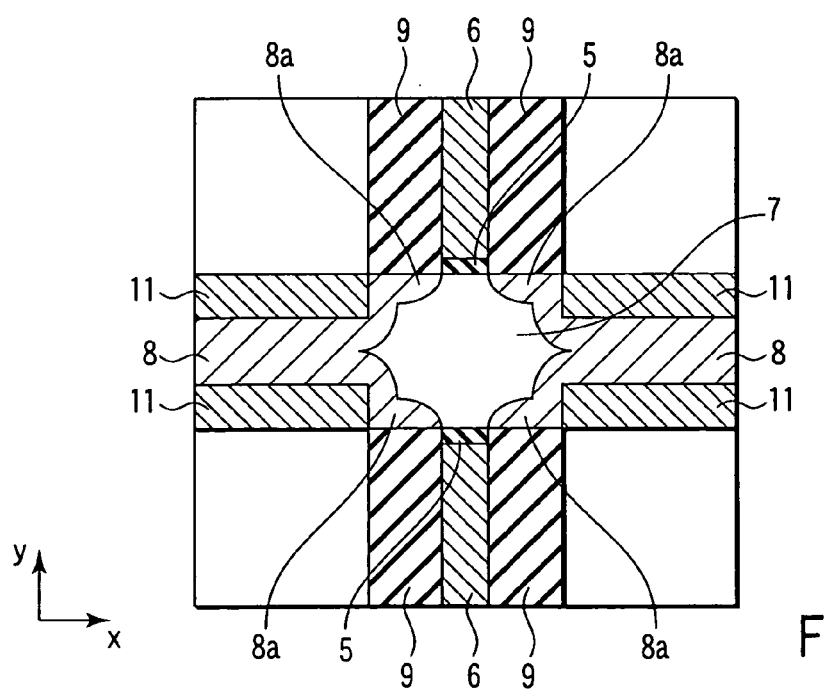
F I G. 51

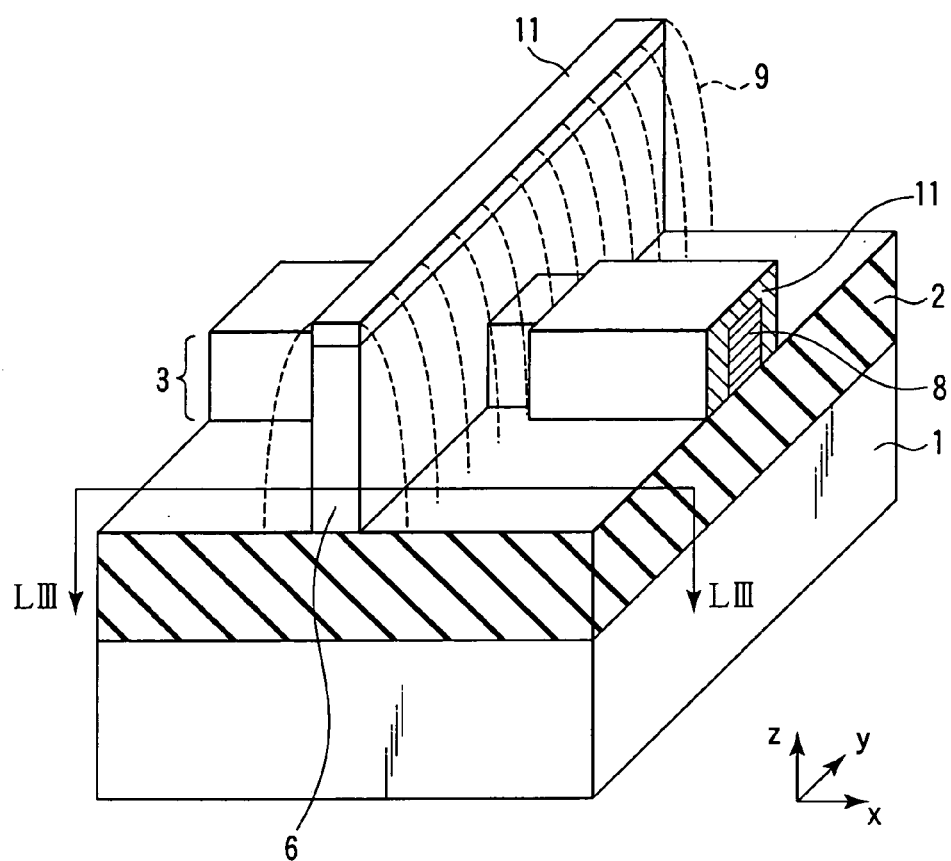
F I G. 52
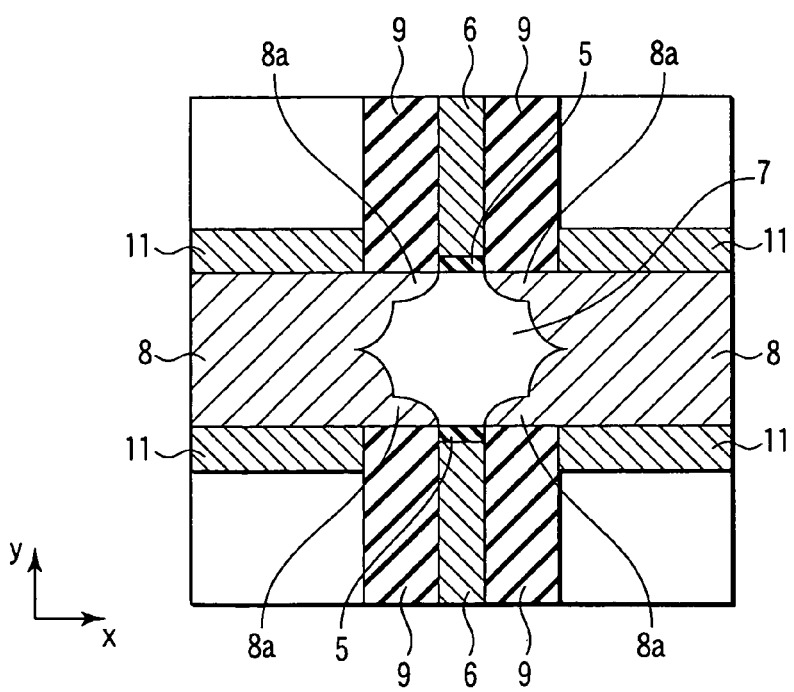
F I G. 53

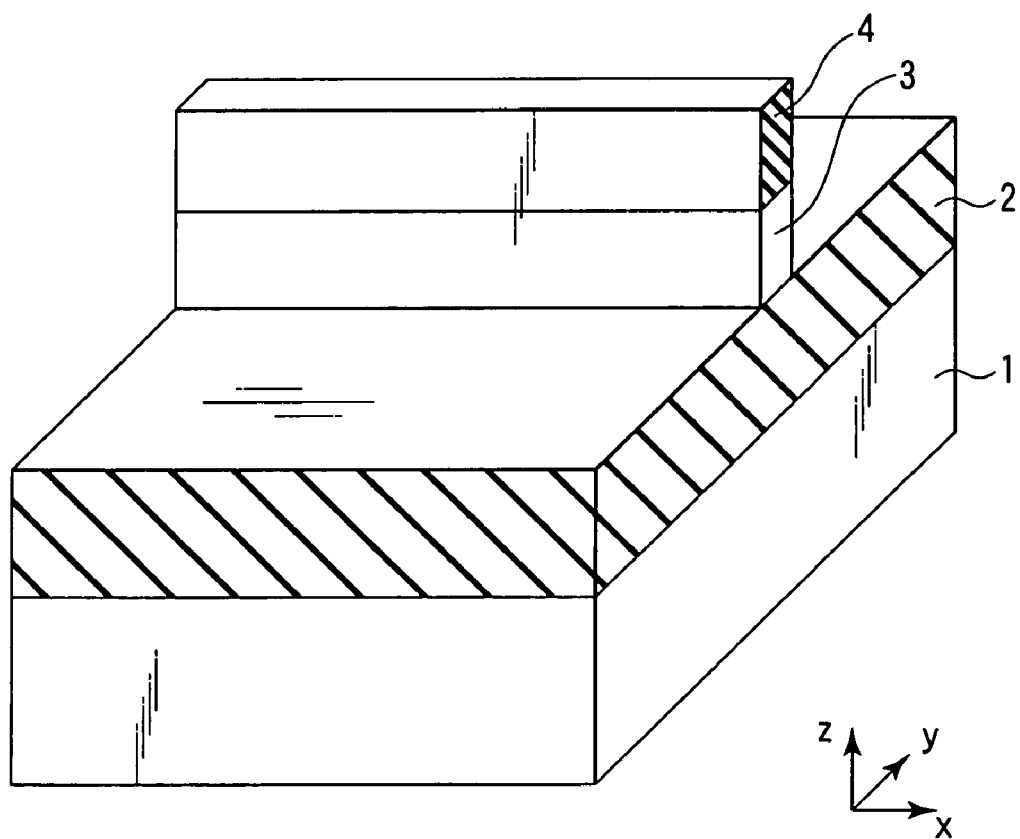
F I G. 56

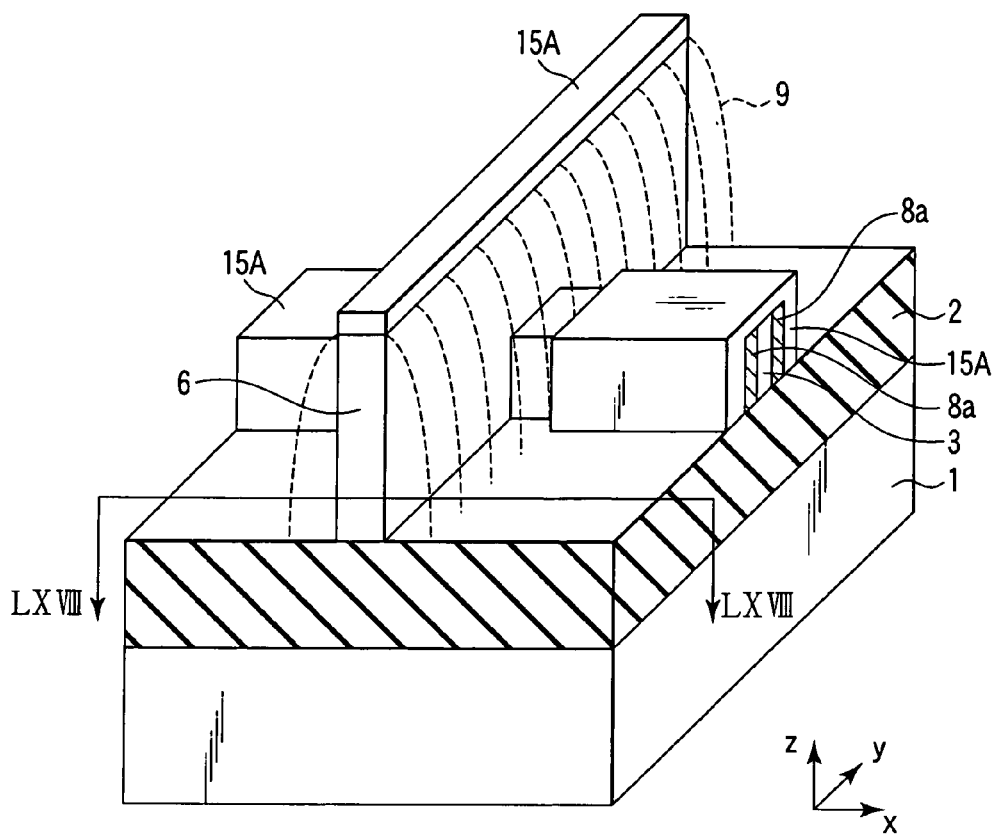
F I G. 67
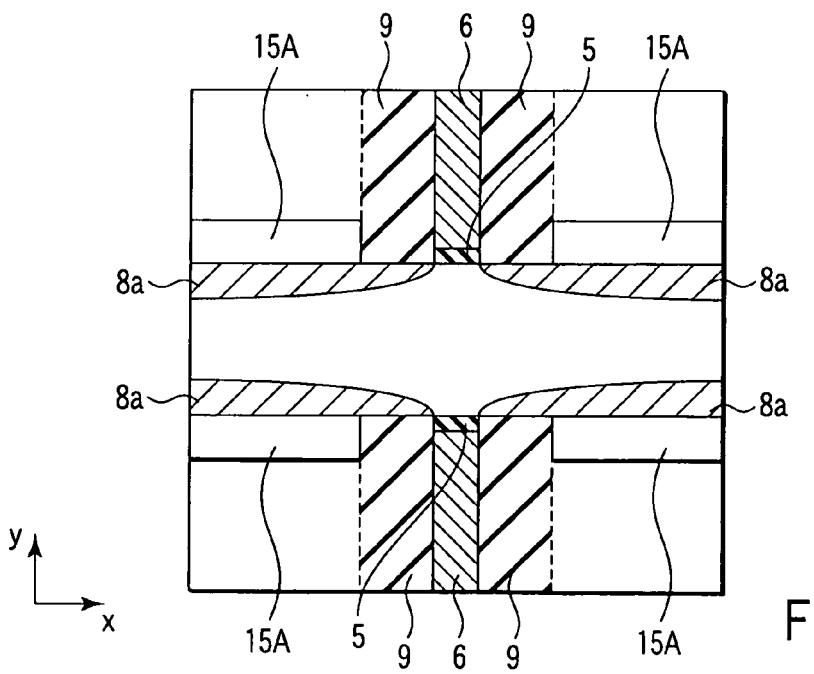
F I G. 68

FIN-SHAPED SEMICONDUCTOR DEVICE

CROSS-REFERENCE TO RELATED APPLICATIONS

This application is based upon and claims the benefit of priority from prior Japanese Patent Application No. 2003-317259, filed Sep. 9, 2003, the entire contents of which are incorporated herein by reference.

BACKGROUND OF THE INVENTION

1. Field of the Invention

The present invention relates to a semiconductor device having an MIS type field effect transistor and a manufacturing method thereof.

2. Description of the Related Art

In recent years, as demands for a realization of a semiconductor integrated circuit with low power consumption and high operating speed or the like become rigid, a realization of a low power supply voltage and a fine element is desired. For this reason, in regard to a transistor element, attention is paid to a three-dimensional element in place of a conventional planar type element.

As the three-dimensional element, there has been known, e.g., an MOS transistor utilizing a fin-shaped semiconductor layer, i.e., a FinFET. The FinFET is superior in suppression of a short channel effect, a low subthreshold slope, high mobility and others as compared with other types of transistors.

FIGS. 1 and 2 show a structural example of the FinFET.

An insulating layer 2 is formed on a silicon substrate 1, and a fin-shaped silicon layer 3 is formed on the insulating layer 2. A so-called SOI substrate is constituted by the silicon substrate 1, the insulating layer 2 and the silicon layer 3.

A cap insulating layer 4 which is used as a mask when processing the silicon layer 3 is formed on the silicon layer 3. A gate electrode 6 is formed on each of two side surfaces of the silicon layer 3 in a direction y through a gate insulating layer 5. In this example, the gate electrode 6 on one side of the silicon layer 3 is separated from that on the other side of the same, but the both gate electrodes 6 may be electrically connected.

An area in the silicon layer 3 sandwiched by the gate electrodes 6 is a channel area 7. Further, in the silicon layer 3, source/drain areas 8 are formed on both sides of the channel area 7. A direction of a current flowing through the channel area 7 is a direction parallel to the surface of the silicon substrate 1, i.e., a direction x.

In case of operating such a FinFET as a fully depleted type element, in order to suppress a short channel effect, a fin in the channel area 7, i.e., a width Wch of the silicon layer 3 in the direction y (width of the channel area) must be set smaller than a gate length Lg. In each generation of LSI, however, since a dimension which can be processed into a minimum level by the lithography technology is usually coordinated with the gate length, it is very hard to form the channel area 7 having a width narrower than the gate length.

Furthermore, in the FinFET shown in FIGS. 1 and 2, the width Wch of the channel area 7 is equal to the width of the fin, i.e., the silicon layer 3 in the source/drain area 8 in the direction y. In this case, when the width Wch of the channel area 7 is reduced in order to suppress the short channel effect, the width of the fin in the source/drain area 8 in the direction y is also decreased. As a result, a parasitic resistance of the source/drain area 8 is increased, thereby lowering a drive current.

Moreover, an effective gate width (effective channel width) of the FinFET is twofold of a height h of the fin, i.e., the silicon layer 3. In order to increase the effective gate width, connecting a plurality of fins in parallel can suffice. On the other hand, in case of the FinFET, impurities must also be implanted into the side surfaces of the silicon layer 3 in order to form a source/drain area. Therefore, the source/drain area is usually formed by a tilted ion implantation method.

When a plurality of fins are connected to each other in parallel, however, a size of a part connecting a plurality of the fins is large. As a result, in the tilted ion implantation method, impurities based on the ion implantation do not spread in the entire source/drain formation planned area in each fin, and there is a problem that an area which is of an electroconductive type opposite to that of the source/drain area partially remains in the source/drain formation planned area.

In case of a planar (flat) transistor, as shown in FIG. 3, parasitic resistances consist of a silicide interface resistance Rc, a silicide sheet resistance Rs, a diffusion layer sheet resistance Rd immediately below the silicide and others, and these resistance components must be reduced in order to realize a high-speed operation.

As shown in FIG. 4, however, in an SOI structure, when a major part of the source/drain area is silicided, the diffusion layer sheet resistance Rd immediately below silicide is increased, and the parasitic resistance becomes large. Additionally, when all of the source/drain area is silicided, the parasitic resistance becomes extremely large. Thus, it is important to sufficiently assure a depth Xd of the diffusion layer immediately below silicide so as to prevent the diffusion layer sheet resistance Rd immediately below silicide from being increased.

In recent years, in order to realize high performances and high density of an element, fruition of fine transistors has been advanced, and a control over a current between the source and the drain by a gate electrode is becoming difficult (short channel effect).

Thus, nowadays, for example, an MOS transistor utilizing a fin-shaped semiconductor layer, i.e., a FinFET has been studied. The FinFET is superior in suppression of the short channel effect, a low subthreshold slope, high mobility and others as compared with other types of transistors.

FIG. 5 shows a structural example of the FinFET.

An insulating layer 2 is formed on a silicon substrate 1, and a fin-shaped silicon layer 3 is formed on the insulating layer 2. A so-called SOI substrate is constituted by the silicon substrate 1, the insulating layer 2 and the silicon layer 3.

A cap insulating layer 4 used as a mask when processing the silicon layer 3 is formed on the silicon layer 3. A gate electrode 6 is formed on two side surface of the silicon layer 3 in a direction y through gate insulating layers 5. In this example, the gate electrode on one side of the silicon layer 3 is electrically connected to the gate electrode 3 on the other side of the same so as to cut across the silicon layer 3, but the both gate electrodes 6 may be electrically separated from each other.

Sidewall insulating layers (sidewalls) 9 are formed on side surface of the gate electrode 6 in a direction x. A cap insulating layer 10 used as a mask when processing the gate electrode 6 is formed on the gate electrode 6.

Here, as shown in FIG. 6, an area in the silicon layer 3 sandwiched by the gate electrodes 6 is a channel area 7. Further, in the silicon layer 3, source/drain areas 8 and source/drain extension areas 8a are formed on both sides of the channel area 7. A direction of a current flowing through the channel area 7 is a direction parallel to a surface of the silicon substrate 1, i.e., the direction x.

Usually, in the FinFET shown in FIG. 5, there is adopted a silicide process which forms a silicide layer on the source/drain areas formed in the silicon layer 3. FIG. 6 shows the FinFET which has been subjected to the silicide process. Silicide layers 11 are formed in the silicon layer 3 (source/drain areas 8). In this example, there occur a problem that a major part of the source/drain areas 8 excluding areas immediately below the sidewall insulating layers 9 is silicided and a parasitic resistance is increased.

That is, the diffusion layer sheet resistance Rd immediately below silicide is increased, and the parasitic resistance becomes considerably high. Such a problem is also true in, e.g., transistors adopting an SOI structure and a double gate structure such as shown in FIG. 7.

Therefore, in the FinFET formed on the SOI substrate, it is necessary to propose a structure by which all of the channel portion is not silicided, reduce the diffusion layer sheet resistance Rd immediately below silicide and decrease the parasitic resistance.

As described above, in the prior art, it is hard to make a width of the fin (width of the channel area) in the channel area smaller than the gate length. Assuming the width of the channel area is smaller than the gate length, since this width is equal to the width of the fin in the source/drain area, there occur problems such as an increase in the parasitic resistance, a reduction in the drive current and others.

In order to control an effective channel width, when a structure that a plurality of fins are connected to each other in parallel is adopted, an area which is of an electroconductive type different from an electroconductive type of the source/drain area partially remains in the source/drain area.

Furthermore, when a silicide layer is provided on the source/drain area, a major part of the source/drain area is silicided since a width of the fin is small, and the diffusion layer sheet resistance immediately below silicide thereby becomes large.

Therefore, the following problems must be examined.

[1] Proposing a structure and a manufacturing method of a three-dimensional element such as a FinFET that ① a width of a channel area is smaller than a gate length, ② a width of a fin in a source/drain extension area is equal to or larger than the width of the channel area, and ③ the width of the fin in the source/drain area is larger than the width of the channel area or the width of the fin in the source/drain extension area.

[2] Proposing a structure and a manufacturing method of a three-dimensional element such as a FinFET in which an effective channel width is controlled by the number of fins connected to each other in parallel rather than heights of the fins, and proposing a structure and a manufacturing method by which an area which is of an electroconductive type different from an electroconductive type of the source/drain area is prevented from partially remaining in the source/drain area.

[3] In regard to a silicide layer provided on the source/drain area in the fin, preventing a major part of the source/drain area from being silicided, reducing the diffusion layer sheet resistance immediately below silicide, thereby suppressing an increase in the parasitic resistance.

BRIEF SUMMARY OF THE INVENTION

According to an example of the present invention, there is provided a semiconductor device comprising: a semiconductor substrate; a fin-formed semiconductor layer which is formed on the semiconductor substrate, is long in a first direction and is short in a second direction crossing the first direction; a gate insulating layer formed on side surfaces of the semiconductor layer in the second direction; a gate electrode arranged so as to be adjacent to the gate insulating layer; a channel area formed at a position adjacent to the gate insulating layer in the semiconductor layer; a source/drain extension area formed at a position adjacent to the channel area in the semiconductor layer in the first direction; and a source/drain area formed at a position adjacent to the source/drain extension area in the semiconductor layer in the first direction, wherein a width of the semiconductor layer in the second direction in the channel area is smaller than a width of the semiconductor layer in the second direction in the source/drain area.

According to an example of the present invention, there is provided a semiconductor device comprising: a semiconductor substrate; a plurality of fin-formed first semiconductor layers which are formed on the semiconductor substrate, long in a first direction, short in a second direction crossing the first direction and aligned in the second direction; a second semiconductor layer which connects a plurality of the first semiconductor layers at end portions of a plurality of the first semiconductor layers in the first direction; a gate insulating layer formed on side surfaces of each of a plurality of the first semiconductor layers in the second direction; a gate electrode arranged so as to be adjacent to the gate insulating layer; a channel area formed at a position adjacent to the gate insulating layer in a plurality of the first semiconductor layers; a source/drain extension area formed at a position adjacent to the channel area in the first direction in a plurality of the first semiconductor layers; and a source/drain area formed at a position adjacent to the source/drain extension area in the first direction in the second semiconductor layer.

According to an example of the present invention, there is provided a semiconductor device comprising: a semiconductor substrate; a fin-formed semiconductor layer which is formed on the semiconductor substrate, is long in a first direction and is short in a second direction crossing the first direction; a gate insulating layer formed on side surfaces of the semiconductor layer in the second direction; a gate electrode arranged so as to be adjacent to the gate insulating layer; a channel area formed at a position adjacent to the gate insulating layer in the semiconductor layer; a source/drain extension area formed at a position adjacent to the channel area in the first direction in the semiconductor layer; a source/drain area formed at a position adjacent to the source/drain extension area in the first direction in the semiconductor layer; and a silicide layer which is formed to a surface portion of the semiconductor layer in the source/drain area but not formed in the entire inner portion of the same.

According to an example of the present invention, there is provided a manufacturing method of a semiconductor device, comprising: a step of forming on a semiconductor substrate a fin-formed semiconductor layer which is long in a first direction and short in a second direction crossing the first direction; a step of forming a dummy gate insulating layer on side surfaces of the semiconductor layer in the second direction; a step of forming a dummy gate electrode adjacent to the dummy gate insulating layer; a step of forming a source/drain extension area and a source/drain area in the semiconductor layer; a step of forming an insulating layer covering the semiconductor layer; a step of polishing or etching the insulating layer and thereby exposing surfaces of the dummy gate insulating layer and the dummy gate electrode; a step of removing the dummy gate insulating layer and the dummy gate electrode; a step of oxidizing the semiconductor layer at a part where the dummy gate insulating layer had been formed and forming an oxide layer; a step of removing the oxide layer; a step of forming a gate insulating layer at a part where the dummy gate insulating layer had been formed; and a step of forming a gate electrode adjacent to the gate insulating layer.

According to an example of the present invention, there is provided a manufacturing method of a semiconductor device, comprising: a step forming on a semiconductor substrate a plurality of fin-formed first semiconductor layers which are long in a first direction and short in a second direction crossing the first direction, and a second semiconductor layer which connects end portions of a plurality of the first semiconductor layers in the first direction; a step of forming a dummy gate insulating layer on side surfaces of a plurality of the first semiconductor layers in the second direction; a step of forming a dummy gate electrode adjacent to the dummy gate insulating layer; a step of forming a source/drain extension area in a plurality of the first semiconductor layers; a step of forming a source/drain area in the second semiconductor layer; a step of forming an insulating layer covering the first and second semiconductor layers; a step of polishing or etching the insulating layer and thereby exposing surfaces of the dummy gate insulating layer and the dummy gate electrode; a step of removing the dummy gate insulating layer and the dummy gate electrode; a step of oxidizing the first semiconductor layers at a part where the dummy gate insulating layer had been formed and forming an oxide layer there; a step of removing the oxide layer; a step of forming a gate insulating layer at a part where the dummy gate insulating layer had been formed; and a step of forming a gate electrode adjacent to the gate insulating layer.

According to an example of the present invention, there is provided a manufacturing method of a semiconductor device, comprising: a step of forming a cap insulating layer on a semiconductor layer on a first insulating layer; a step of etching the semiconductor layer by using the cap insulating layer as a mask, and forming the semiconductor layer into a fin shape which is long in a first direction and short in a second direction crossing the first direction; a step of forming a second insulating layer covering the semiconductor layer; a step of polishing or etching the second insulating layer and thereby exposing a surface of the cap insulating layer; a step of etching the cap insulating layer by isotropic etching and thereby reducing a size of the cap insulating layer; a step of forming a first resist having a slit whose width is smaller than a width of the semiconductor layer in the first direction; a step of etching the semiconductor layer by using the cap insulating layer and the first resist as masks, and making a width of the semiconductor layer at a central portion in the second direction smaller than a width in the second direction of the semiconductor layer at an end portion in the first direction; a step of forming a source/drain extension area at the central portion of the semiconductor layer; and a step of forming a source/drain area at the end portion of the semiconductor layer in the first direction.

According to an example of the present invention, there is provided a manufacturing method of a semiconductor device, comprising: a step of forming on a semiconductor substrate a fin-shaped semiconductor layer which is long in a first direction and short in a second direction crossing the first direction; a step of forming a gate insulating layer on side surfaces of the semiconductor layer in the second direction; a step of forming a gate electrode adjacent to the gate insulating layer; a step of forming a source/drain extension area in the semiconductor layer by tilted ion implantation; a step of forming a sidewall insulating layer on sidewalls of the gate electrode; a step of forming a source/drain area by a combination of tilted ion implantation and vertical ion implantation or by vertical ion implantation; and a step of forming a silicide layer on the gate electrode and a surface of the source/drain area, wherein conditions of silicidation are set so as not to form the silicide layer in the entire inner portion of the semiconductor layer in the source/drain area.

According to an example of the present invention, there is provided a manufacturing method of a semiconductor device, comprising: a step of forming on a semiconductor substrate a fin-shaped first semiconductor layer which is long in a first direction and short in a second direction crossing the first direction, a silicidation stopper on the first semiconductor layer, and a second semiconductor layer on the silicidation stopper; a step of forming a gate insulating layer on side surface of the first semiconductor layer in the second direction; a step of forming a gate electrode adjacent to the gate insulating layer; a step of forming a source/drain extension area in the first semiconductor layer; a step of forming a sidewall insulating layer on sidewalls of the gate electrode; a step of growing an epitaxial layer on surfaces of the first and second semiconductor layers by a selected growth, and coupling the epitaxial layer from the first layer with the epitaxial layer from the second semiconductor layer; a step of forming a source/drain area in the first semiconductor layer; and a step of forming a silicide layer on the gate electrode, the second semiconductor layer and the epitaxial layer, wherein the silicidation stopper functions as a stopper in silicidation so as to prevent silicidation from advancing from a top portion of the first semiconductor layer in silicidation.

BRIEF DESCRIPTION OF THE SEVERAL VIEWS OF THE DRAWING

FIG. 15 is a view showing a FinFET according to a first embodiment of the present invention;

FIG. 16 is a cross-sectional view taken along the line XVI—XVI in FIG. 15;

FIG. 17 is a view showing a first example of a manufacturing method according to the first embodiment;

FIG. 18 is a cross-sectional view taken along the line XVIII—XVIII in FIG. 17;

FIG. 43 is a view showing a FinFET according to a second embodiment of the present invention;

FIG. 44 is a cross-sectional view taken along the line XLIV—XLIV in FIG. 43;

FIG. 50 is a view showing a structural example 1 of a FinFET according to a third embodiment of the present invention;

FIG. 51 is a cross-sectional view taken along the line LI—LI in FIG. 50;

FIG. 52 is a view showing a structural example 2 of the FinFET according to the third embodiment of the present invention;

FIG. 53 is a cross-sectional view taken along the line LIII—LIII in FIG. 52;

FIG. 56 is a view showing a first example of the manufacturing method according to the third embodiment;

FIG. 67 is a view showing the second example of the manufacturing method according to the third embodiment;

FIG. 68 is a cross-sectional view taken along the line LXVIII—LXVIII in FIG. 67;

DETAILED DESCRIPTION OF THE INVENTION

A best mode for embodying the present invention will now be described in detail hereinafter with reference to the accompanying drawings.

1. Outline

Examples of the present invention are roughly constituted by the following three.

[1] First, in regard to a three-dimensional transistor element such as a FinFET, the following structure is adopted in order to realize suppression of a short channel effect, an increase in drive current due to a reduction in parasitic resistance, and others.

Figure 1:
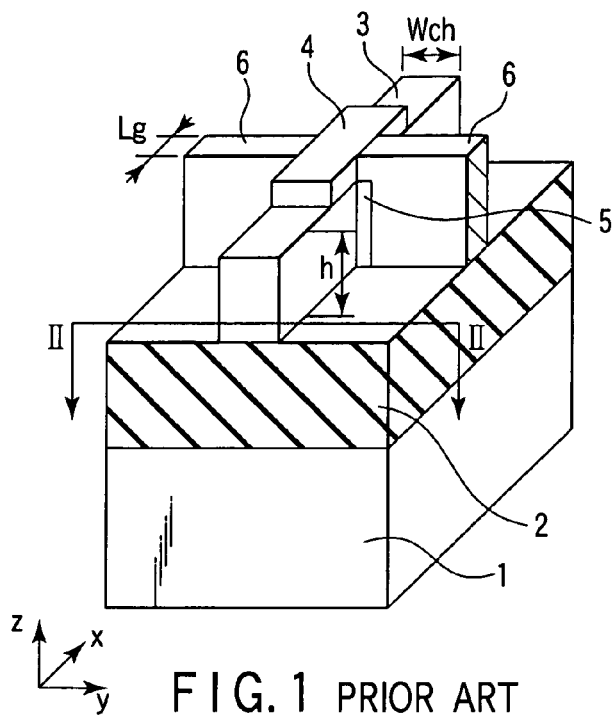
FIG. 1 is a view showing an example of a conventional FinFET.
Figure 2:
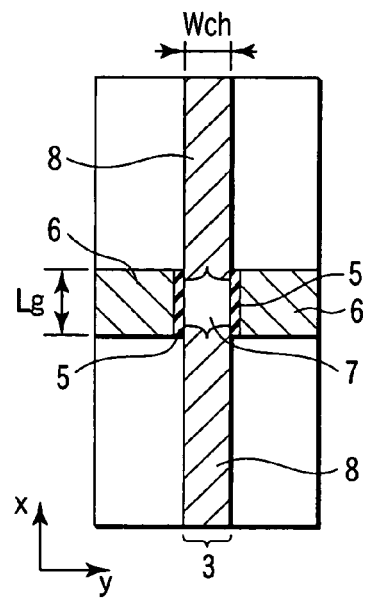
FIG. 2 is a cross-sectional view taken along the line II—II in FIG. 1.
Figure 5:
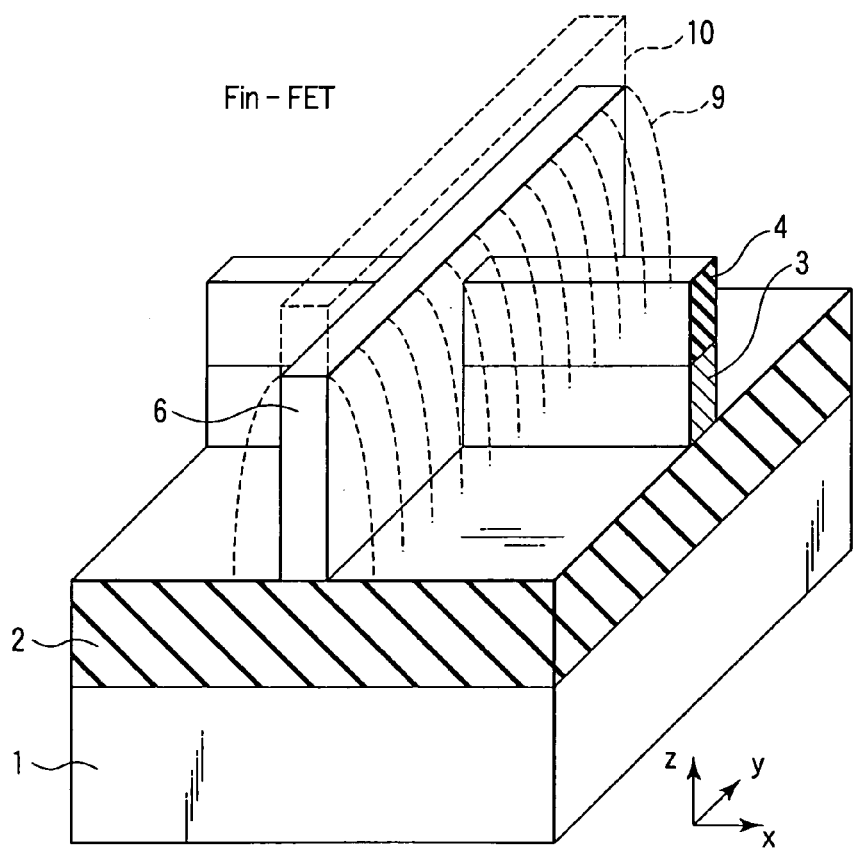
FIG. 5 is a view showing an example of a conventional FinFET.
Figure 3:
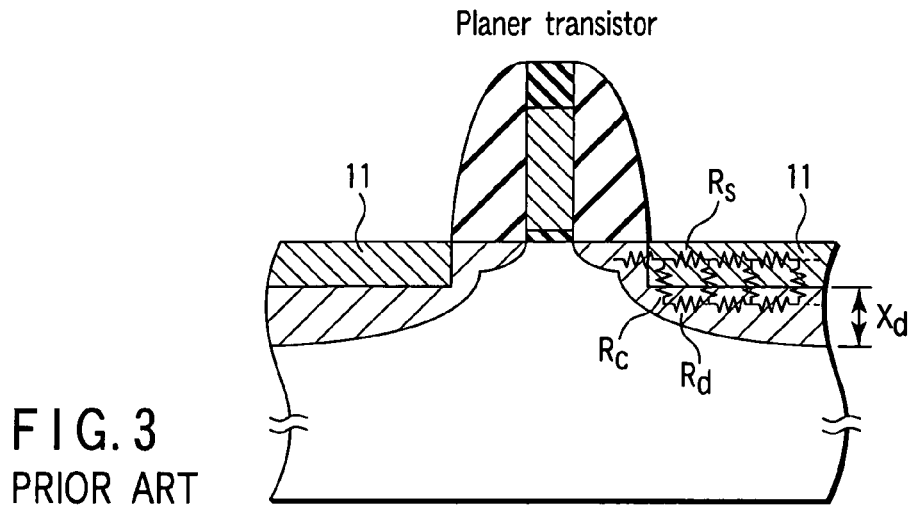
FIG. 3 is a view showing an example of a conventional transistor.
Figure 4:
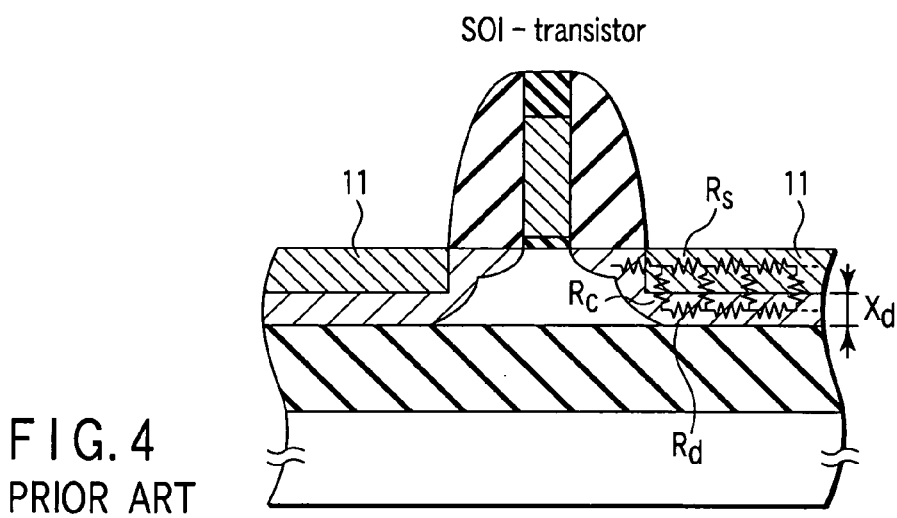
FIG. 4 is a view showing the example of the conventional transistor.
Figure 6:
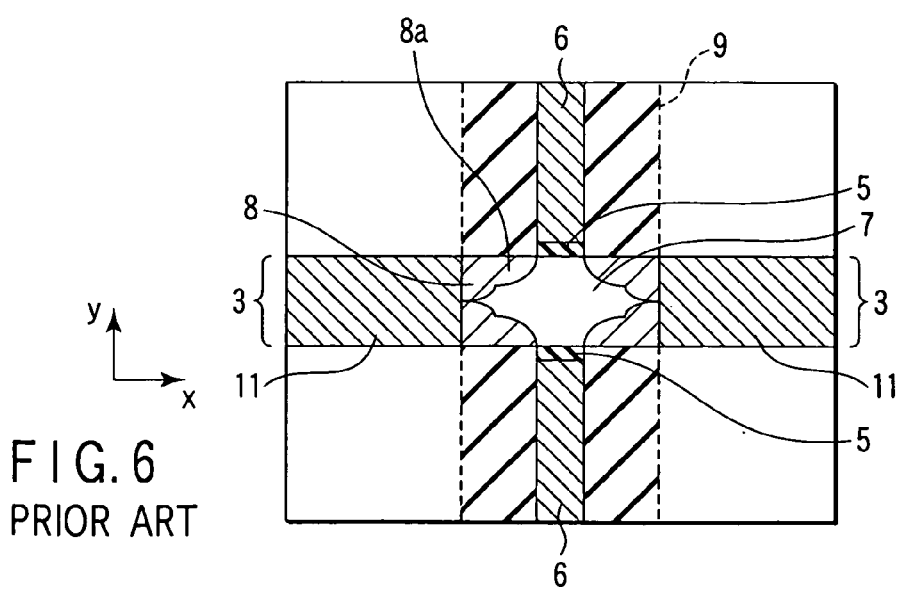
FIG. 6 is a view showing the example of the conventional FinFET.
Figure 7:
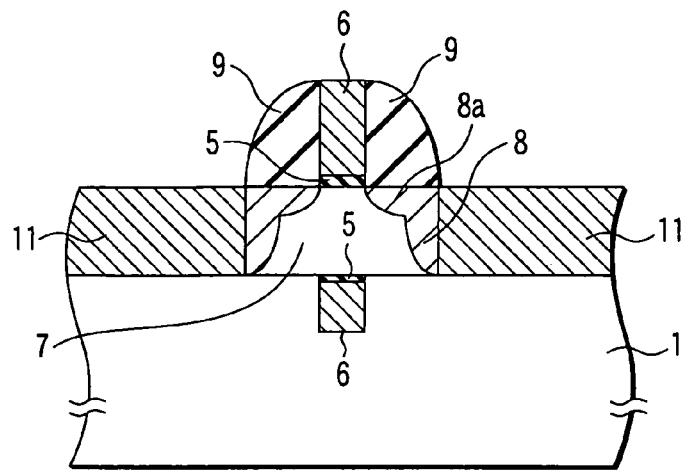
FIG. 7 is a view showing an example of a conventional transistor.
Figure 8:
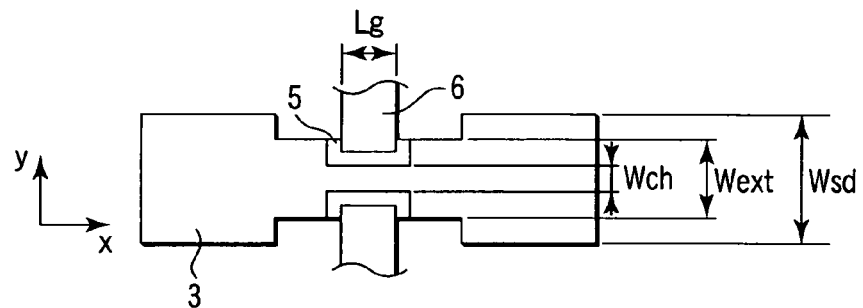
FIG. 8 is a view showing an outline of an example of the present invention.

That is, as shown in FIG. 8, a width of a fin in a channel area in a direction y, i.e., a width Wch of the channel area is set smaller than a gate length Lg, thereby suppressing the short channel effect. Further, a width Wsd of the fin in a source/drain area is set larger than a width Wch of the channel area or a width Wext of the fin in a source/drain extension area, and suppression of the short channel effect is thereby realized simultaneously with an increase in drive current due to a reduction in a parasitic resistance (Wch≦Wext<Wsd).

Figure 9:
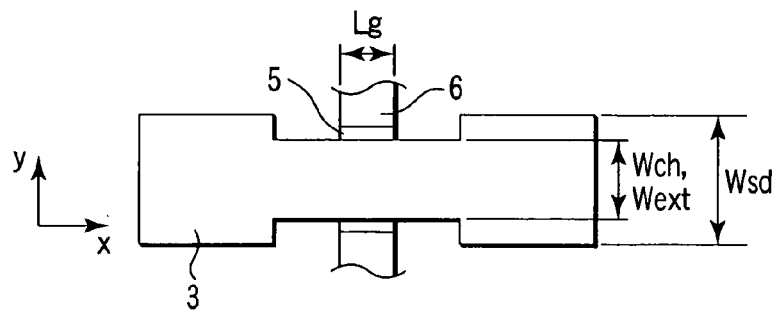
FIG. 9 is a view showing an outline of an example of the present invention.

The width Wext of the fin in the source/drain extension area may be equal to the width Wch of the channel area (Wch=Wext) as shown in FIG. 9, or it may be larger than the same (Wch<Wext) as shown in FIG. 8.

Figure 10:
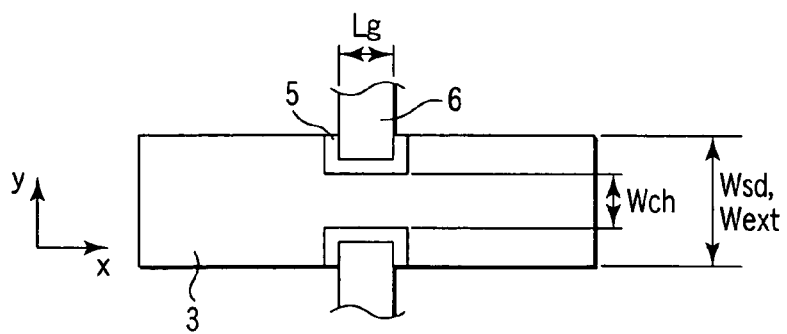
FIG. 10 is a view showing an outline of an example of the present invention.

Furthermore, when the relationship of Wch<Wext is provided, the width Wsd of the fin in the source/drain area may be equal to the width Wext of the fin in the source/drain extension area (Wext=Wsd) as shown in FIG. 10, or it may be larger than the same (Wext<Wsd) as shown in FIG. 8.

Figure 11:
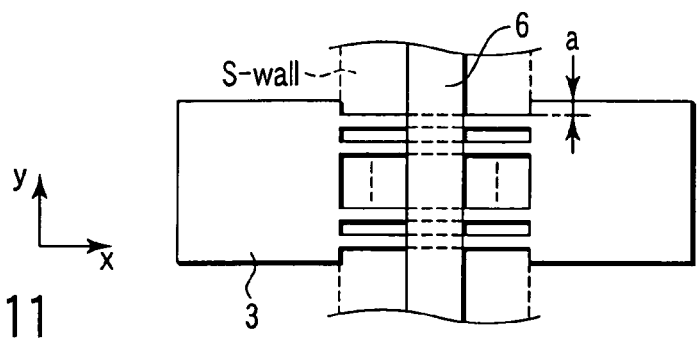
FIG. 11 is a view showing an outline of an example of the present invention.

[2] Then, as shown in FIG. 11, an effective channel width of the three-dimensional element such as a FinFET is controlled by the number of fins connected to each other in parallel in place of heights of the fins.

Usually, a plurality of transistors having different effective channel widths are formed in an LSI. In this case, when the effective channel width of each transistor is adjusted by only the heights of the fins, the fins on a silicon substrate have different heights, and processing of the fins becomes complicated. Moreover, flattening the top face of the fin is difficult, and it is hard to correctly perform subsequent processing steps including photolithography.

Thus, as to the three-dimensional element such as a FinFET, there are proposed a structure and a manufacturing method by which its effective channel width is 2×h×n. However, it is assumed that one transistor is constituted by n (n is a natural number) fins connected to each other in parallel and all n fins have the same height h.

Additionally, in regard to a three-dimensional transistor element such as a FinFET having a structure that such n fins are connected to each other in parallel, an implantation angle θ of tilted ion implantation for forming the source/drain area is determined as an angle with respect to a plane vertical to a surface of the semiconductor substrate, e.g., a range of $0°<θ≦45°$ or preferably $10°≦θ≦30°$, and an area which is of an electroconductive type different from an electroconductive type of the source/drain area is prevented from partially remaining in the source/drain area.

Figure 12:
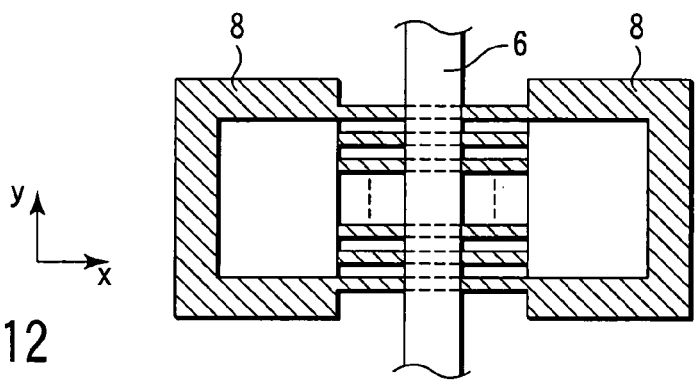
FIG. 12 is a view showing an outline of an example of the present invention.

It is hard to form the source/drain area (indicated by hatching) 8 in the entire fin by only the conventional tilted ion implantation as shown in FIG. 12, whereas the source/drain area can be readily formed in the entire fin according to the above-described method.

Figure 13:
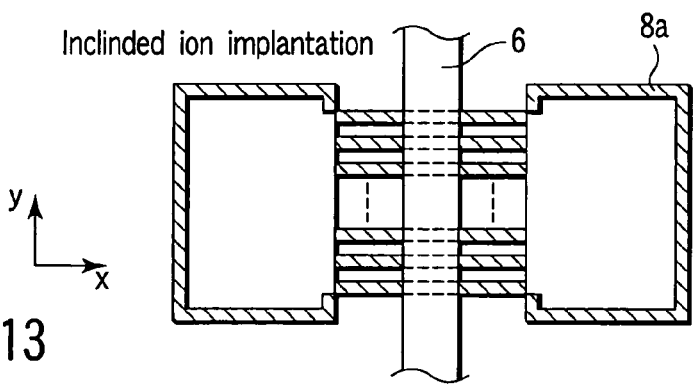
FIG. 13 is a view showing an outline of an example of the present invention.
Figure 14:
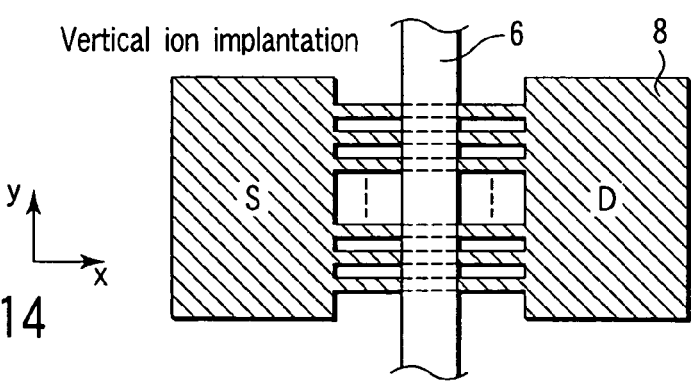
FIG. 14 is a view showing an outline of an example of the present invention.

Incidentally, as to ion implantation for forming, e.g., the source/drain area, tilted ion implantation (implantation angle θ falls within a range of $0°<θ≦90°$) may be combined with a vertical ion implantation (implantation angle is 0°) as shown in FIGS. 13 and 14 besides the above method.

The ion implantation method and the implantation angle for forming the source/drain extension area do not have to be the same as the ion implantation method and the implantation angle for forming the source/drain area. They may be the same or different from each other.

The source/drain extension area may be formed by the tilted ion implantation method, and the source/drain area may be formed by the vertical ion implantation method or a combination of the vertical ion implantation method and the tilted ion implantation method.

Before ion implantation, for example, germanium (Ge), silicon (Si) or the like is ion-implanted into a source/drain formation planned area, and the source/drain formation planned area is amorphousized. Additionally, after ion implantation for forming the source/drain area, low-temperature annealing at approximately 600° C. is carried out, thereby suppressing impurity diffusion to a minimum level.

[3] Then, for example, in regard to a three-dimensional transistor element such as a FinFET having a silicide layer on the source/drain area in the fin, the following structure and manufacturing method are adopted in order to prevent a large part or all of the source/drain area from being silicided.

First, conditions of a silicide process are determined so as to leave a silicon layer with a sufficient thickness immediately below a silicide layer. For example, a width of a fin-shaped silicon layer (shorter width), a thickness of a high-melting point metal layer deposited on the silicide layer, a time of silicidation and other are controlled.

Second, an elevated source/drain process is adopted, and the silicon layer is selectively grown on the fin-shaped silicon layer. As a result, in the source/drain formation planned area, a width of the silicon layer is substantially increased, and the increased silicon layer functions as consumption silicon in silicidation. Therefore, the silicon layer with a sufficient thickness can be left immediately below the silicide layer.

Third, a silicidation stopper (e.g., silicon dioxide) used to avoid excessive silicidation of the silicon layer is provided in order to prevent a large part or all of the source/drain area from being silicided. In silicidation, since this stopper suppresses silicidation of the silicon layer, the silicon layer with a sufficient thickness can be left immediately below the silicon layer.

Adopting such a structure or a manufacturing method can suppress an increase in a diffusion layer sheet resistance immediately below silicide, thereby contributing to a reduction in a parasitic resistance.

2. First Embodiment

The first embodiment concerns a structure and a manufacturing method of a FinFET which realize suppression of the short channel effect, an increase in a drive current due to a reduction in a parasitic resistance, and others.

(1) Structure

FIGS. 15 and 16 show a structure of the FinFET according to the first embodiment of the present invention. FIG. 16 is a cross-sectional view taken along the line XVI—XVI in FIG. 15.

An insulating layer 2 is formed on a silicon substrate 1, and a fin-shaped silicon layer 3 is formed on the insulating layer 2. A so-called SOI substrate is constituted by the silicon substrate 1, the insulating layer 2 and the silicon layer (fin) 3.

A cap insulating layer 4 used as a mask when processing the silicon layer 3 is formed on the insulating layer 2. A gate electrode 6 is formed on each of two side surfaces of the silicon layer 3 in a direction y through a gate insulating layer 5. Although the gate electrode 6 on one side of the silicon layer 3 is separated from that on the other side of the same in this example, they may be electrically connected to each other so as to cut across the silicon layer 3.

A sidewall insulating layer (sidewall) 9 is formed on each side surface of the gate electrode 6 in a direction x. An area in the silicon layer 3 sandwiched by the gate electrode 6 is a channel area 7. Further, in the silicon layer 3, source/drain areas 8 and source/drain extension areas 8*a* are formed on both sides of the channel area 7. A direction of a current flowing through the channel area 7 is a direction parallel to the surface of the silicon substrate 1, i.e., a direction x.

Silicide layers 11 are formed on the source/drain areas 8. In this example, the silicide layers 11 are formed on the source/drain areas 8 exposed at an opening portion of an insulating layer 12, i.e., three side surfaces and a top surface of the silicon layer 3.

In such a FinFET, a twofold of a height h of the silicon layer 3 corresponds to an effective gate width (effective channel width). Furthermore, a width (shorter one) of the silicon layer 3 is not fixed, but is gradually increased from a central portion to an end portion on three stages.

That is, a width Wext of the silicon layer 3 in the source/drain extension area 8*a* is larger than a width of the silicon layer 3 in the channel area, i.e., a width Wch of the channel area. Moreover, a width Wsd of the silicon layer 3 in the source/drain area 8 is larger than the width Wext of the silicon layer 3 in the source/drain extension area 8*a*.

Therefore, by decreasing the width Wch of the channel area and increasing the width Wsd of the silicon layer 3 in the source/drain area 8, an impurity concentration of the source/drain area 8 can be made sufficiently high and deep, thereby greatly reducing the parasitic resistance.

Additionally, when a gate length of the gate electrode 6 is determined as Lg, the width Wch of the channel area can be set smaller than the gate length Lg, thereby effectively suppressing the short channel effect.

Although will be described later, the width Wch of the channel area is set smaller than the gate length Lg by a special method in this example. Therefore, even if a dimension which can be processed into a minimum level by the lithography technique is coordinated with the gate length Lg, the silicon layer 3 can be formed with a width equal to or larger than that dimension.

(2) Manufacturing Method

An example of a manufacturing method for realizing the structure shown in FIGS. 15 and 16 will now be described.

① EXAMPLE 1

First, as shown in FIGS. 17 and 18, for example, a silicon substrate 1 is prepared, and a buried insulating layer (e.g., silicon dioxide) 2 is formed in this silicon substrate 1. In the drawing, although a silicon layer (fin) 3 is formed on the buried insulating layer 2, this silicon layer 3 is originally a part of the silicon substrate 1.

A cap insulating layer 4 as a mask material is formed on the silicon substrate 1 (silicon layer 3 in the drawing) by, e.g., LPCVD. Then, the cap insulating layer 4 is patterned by the photolithography and RIE, and the silicon substrate 1 (silicon layer 3 in the drawing) is etched with this cap insulating layer 4 being used as a mask by RIE. As a result, the silicon layer 3 is formed on the buried insulating layer 2.

It is to be noted that a substrate having the insulating layer embedded in the silicon substrate from the beginning, e.g., an SIMOX substrate may be used as the SOI substrate.

The cap insulating layer 4 is constituted by a stacked structure of, e.g., silicon dioxide and silicon nitride. Further, the silicon layer 3 is formed in such a manner that a width W1 at a part which will be a source/drain area later becomes larger than a width W2 at a part which will be a channel area later in order to reduce a parasitic resistance.

In this example, although the fin (silicon layer 3) is formed on the assumption of the SOI substrate, the SOI structure may be alternatively realized by forming the fin on a regular silicon substrate by the photolithography and RIE and then embedding the insulating layer, for example.

Figures 19, 20:
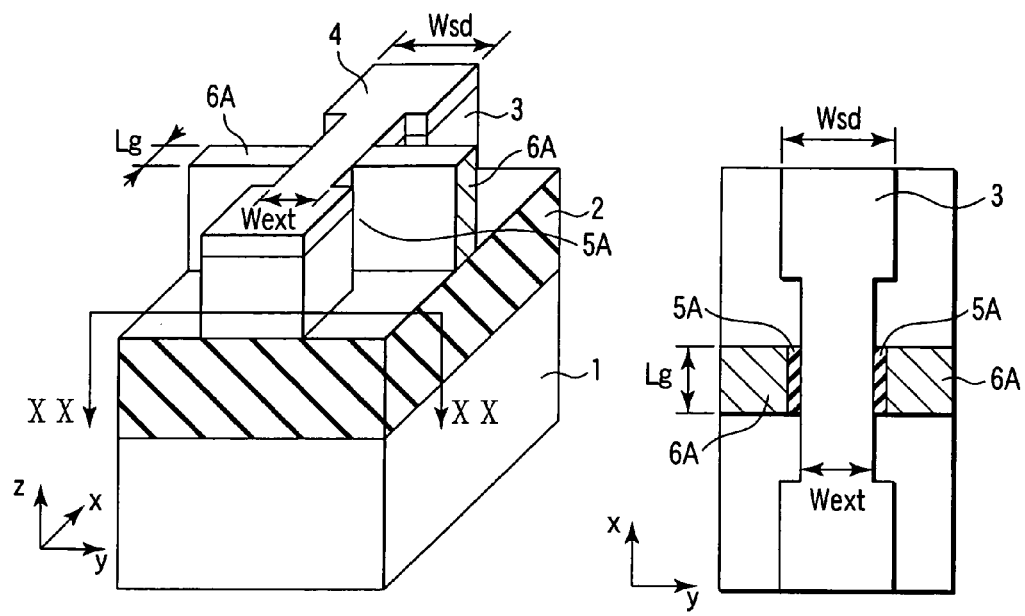
FIG. 19 is a view showing the first example of the manufacturing method of the first embodiment.
FIG. 20 is a cross-sectional view taken along the line XX—XX in FIG. 19.

Subsequently, as shown in FIGS. 19 and 20, a dummy gate insulating layer 5A is formed on each side surface of the silicon layer 3 by, e.g., LPCVD, and then a polysilicon layer (dummy gate electrode 6A in the drawing) is formed on each dummy gate insulating layer 5A. Furthermore, a top face of the polysilicon layer is made substantially the same as a top face of the cap insulating layer 4 (flattening) by using the cap insulating layer 4 as a stopper, for example.

Thereafter, the polysilicon layer is processed by the photolithography and RIE, and the dummy gate electrode 6A having such a gate length Lg as shown in the drawing is formed.

Figures 21, 22:
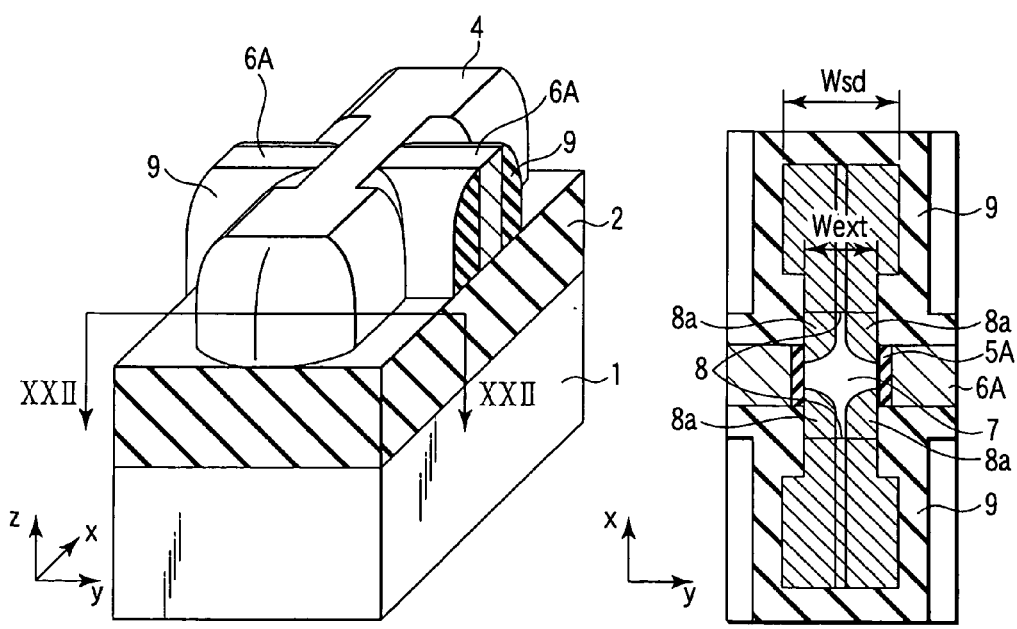
FIG. 21 is a view showing the first example of the manufacturing method according to the first embodiment.
FIG. 22 is a cross-sectional view taken along the line XXII—XXII in FIG. 21.

Then, as shown in FIGS. 21 and 22, impurities are implanted to a surface area of the silicon layer 3 by tilted ion implantation (implantation angle $\theta$ is, e.g., $10° \leq \theta \leq 30°$), thereby forming source/drain extension areas 8*a*. Thereafter, silicon nitride which completely covers the silicon layer 3 is formed on the buried insulating layer 2 by, e.g., LPCVD. Then, this silicon nitride is etched by RIE, and sidewall insulating layers (sidewalls) 9 are formed.

Although the sidewall insulating layer 9 is formed on each of sidewalls of the dummy gate electrode 6A and sidewalls of the silicon layer 3, various conditions may be set in such a manner that it is formed on only the sidewalls of the dummy gate electrode 6A, for example.

Thereafter, impurities are again implanted into the silicon layer 3 by tilted ion implantation (low angle) or vertical ion implantation (implantation angle $\theta$ is 0°), thereby forming source/drain areas 8.

Here, before the ion implantation for forming the source/drain areas 8, e.g., germanium (Ge) or silicon (Si) may be ion-implanted into the source/drain formation planned areas so that the source/drain formation planned areas are amorphousized. In this case, after the ion implantation for forming the source/drain areas 8, performing low-temperature annealing (SPE (Solid Phase Epitaxial regrowth)) at approximately 600° C. can suppress the impurity diffusion to the minimum level.

Moreover, after the sidewall insulating layers 9, the epitaxial growth may be carried out in order to form an epitaxial layer on the surface of the silicon layer 3.

Figures 23, 24:
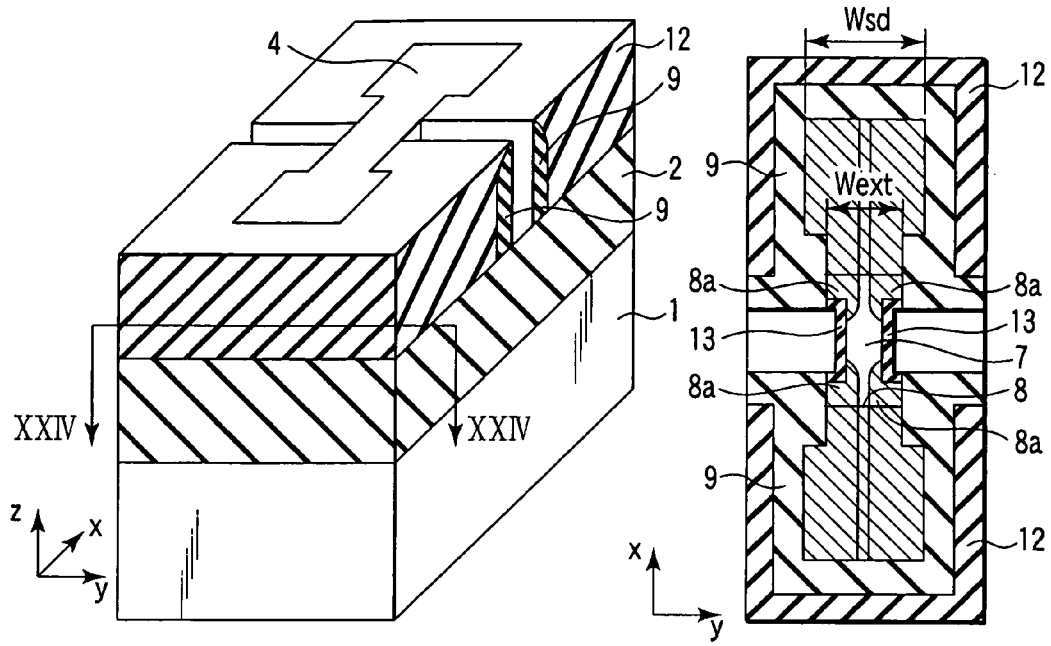
FIG. 23 is a view showing the first example of the manufacturing method according to the first embodiment.
FIG. 24 is a cross-sectional view taken along the line XXIV—XXIV in FIG. 23.

Then, as shown in FIGS. 23 and 24, insulating layers (e.g., silicon dioxide) 12 which completely cover the silicon layer 3 are formed on the buried insulating layer 2. Additionally, the insulating layers 12 are polished by CMP with the cap insulating layer 4 being used as a stopper, and top faces of the insulating layers 12 are made substantially the same as the top face of the cap insulating layer 4 (flattening), for example.

As a result, the top face of each dummy gate electrode 6A (see FIGS. 21 and 22) is exposed. Thereafter, when the dummy gate electrodes 6A and the dummy gate insulating layers 5A are removed, slit-shaped holes are formed at those parts, and the surface of the silicon layer 3 is partially exposed. Then, when the exposed silicon layer 3 is oxidized by thermal oxidation, silicon dioxide layers 13 are formed so as to consume the silicon layer 3.

Figures 25, 26:
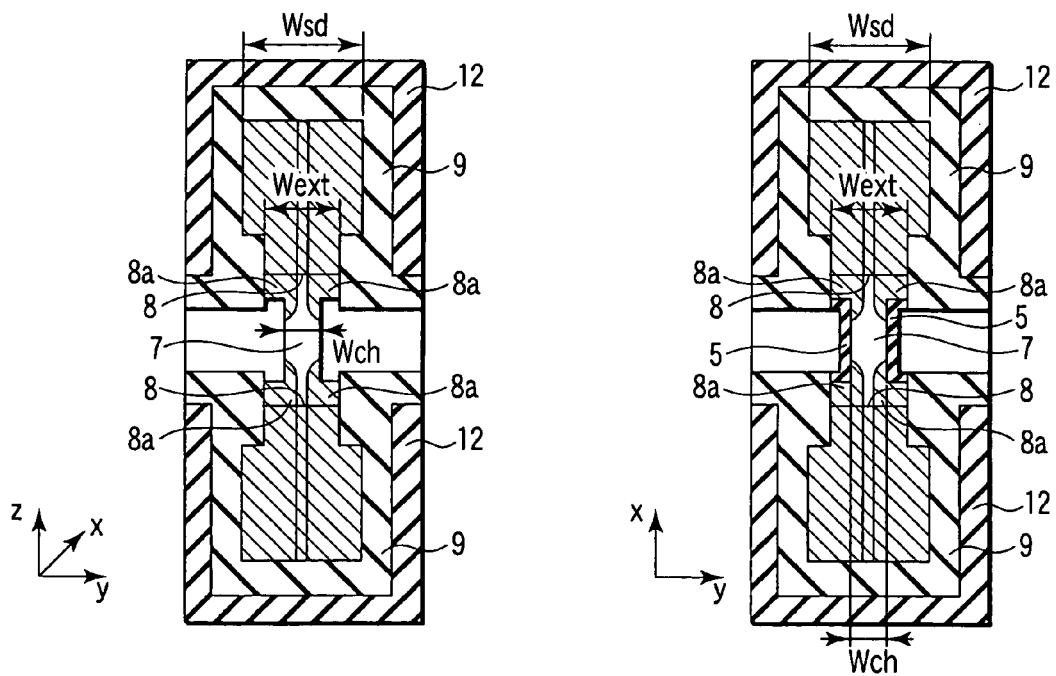
FIG. 25 is a view showing the first example of the manufacturing method according to the first embodiment.
FIG. 26 is a view showing the first example of the manufacturing method according to the first embodiment.

Thereafter, when the silicon dioxide layers 13 are selectively removed, a concave portion is formed in the channel area 7 of the silicon layer 3 as shown in FIG. 25.

As a result, a width Wch of the channel area 7 is smaller than a width Wext of the fin in the source/drain extension areas 8a. That is, assuming that Wsd is a width of the fin in the source/drain areas 8, a relationship of Wch<Wext<Wsd can be obtained.

As a result, an increase in a drive current due to a reduction in a parasitic resistance in the source/drain areas 8 can be realized. Further, in this example, the width Wch of the channel area 7 can be readily made smaller than the gate length Lg without using the photolithography, which can contribute to suppression of the short channel effect.

Thereafter, as shown in FIG. 26, thermal oxidation is again performed, and gate insulating layers (silicon dioxide) 5 are formed.

Figure 27:
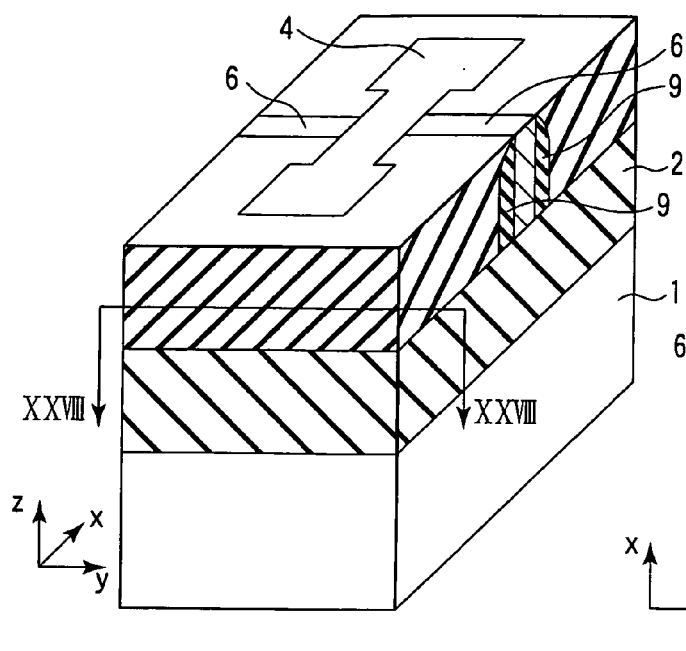
FIG. 27 is a view showing the first example of the manufacturing method according to the first embodiment.
Figure 28:
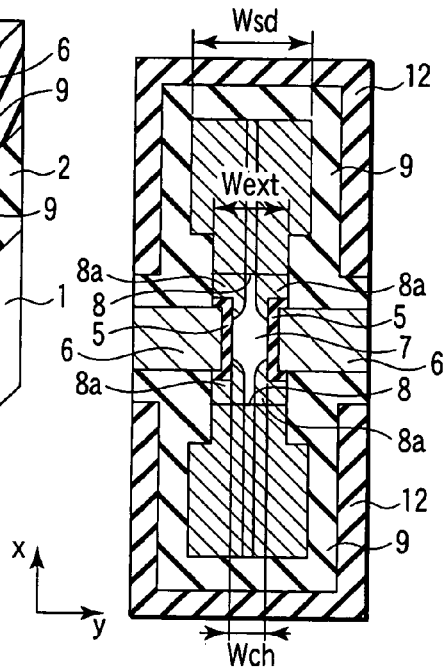
FIG. 28 is a cross-sectional view taken along the line XXVIII—XXVIII in FIG. 27.

Subsequently, as shown in FIGS. 27 and 28, polysilicon layers are formed so as to completely fill the slit-shaped holes formed to the insulating layers 12 by the LPCVD method. When the polysilicon layers are polished or etched back by CMP, self-aligned gate electrodes 6 are formed in the channel area 7 in the silicon layer 3.

Thereafter, impurities are implanted into the gate electrodes 6 by the ion implantation method, and a thermal process for activation of the impurities is conducted.

Here, in regard to the gate electrodes 6, a metal such as tungsten (W) or molybdenum (Mo) may be used in place of polysilicon. When the metal is used for the gate electrodes 6 in this manner, since so-called depletion of the gate electrodes is not generated, which can contribute to an improvement in a drive current.

Figure 29:
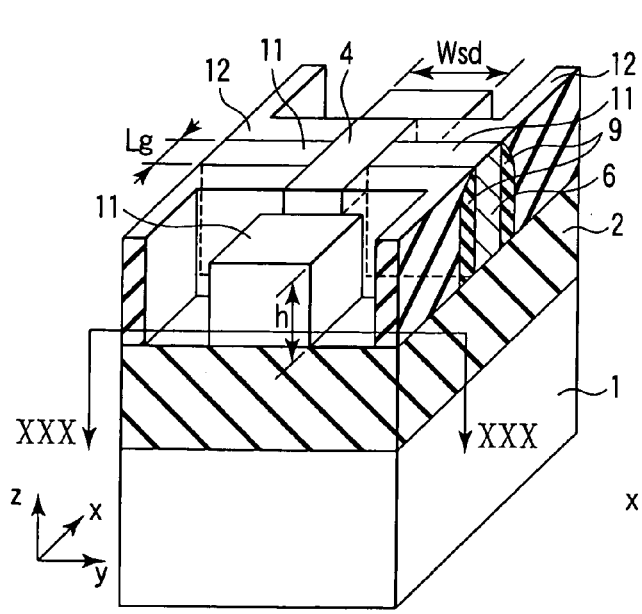
FIG. 29 is a view showing the first example of the manufacturing method according to the first embodiment.
Figure 30:
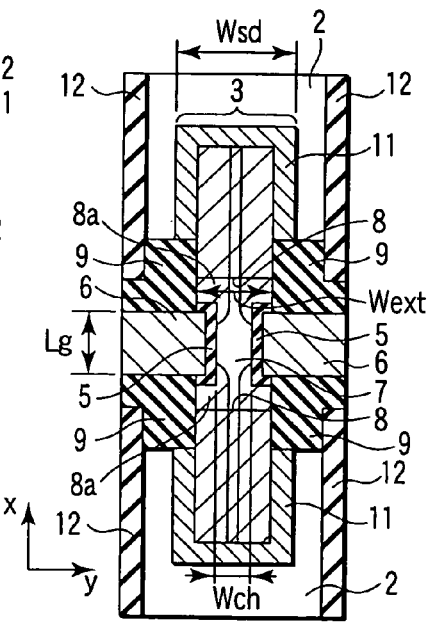
FIG. 30 is a cross-sectional view taken along the line XXX—XXX in FIG. 29.

Then, as shown in FIGS. 29 and 30, the cap insulating layer 4, the sidewall insulating layers 9 and the insulating layers 12 are partially etched by the photolithography and RIE, an opening portion which reaches each source/drain area 8 is formed on each source/drain area 8. Thereafter, a metal layer consisting of, e.g., nickel (Ni), cobalt (Co) or titanium (Ti) is formed on the entire upper portions of the insulating layers 2 and 12 including this opening portion, and a thermal process is performed.

As a result, metal silicide layers 11 are formed on each of top faces and side surfaces of the source/drain areas 8 and the top faces of the gate electrodes 6. Furthermore, thereafter, the metal layer which has not been converted into the metal silicide layer 11 is removed.

Such a FinFET as shown in FIGS. 15 and 16 is completed by the above-described steps.

Thereafter, although not shown, when an interlayer insulating layer, a contact, a wiring layer and others are formed by a regular wafer process, a semiconductor integrated circuit having an MIS type transistor is completed.

② EXAMPLE 2

Figure 31:
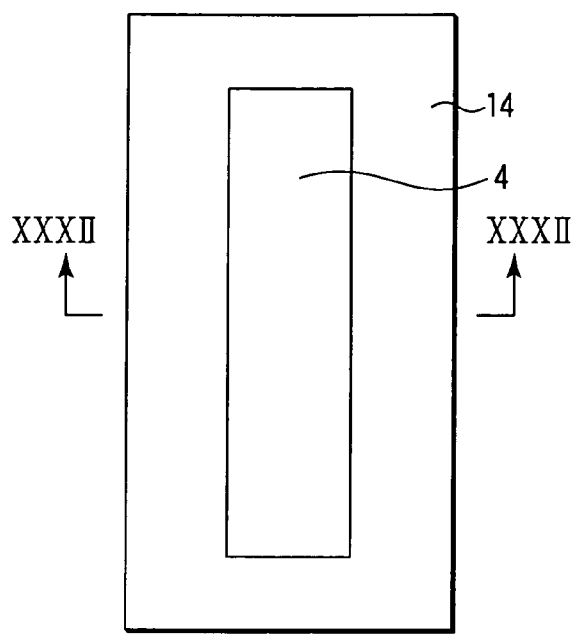
FIG. 31 is a view showing a second example of the manufacturing method according to the first embodiment.
Figure 32:
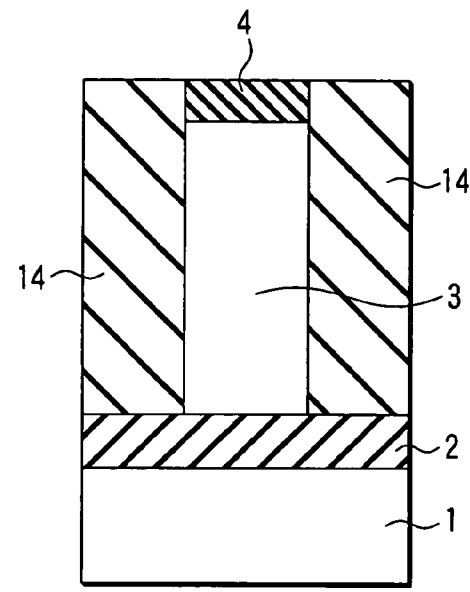
FIG. 32 is a cross-sectional view taken along the line XXXII—XXXII in FIG. 31.

First, as shown in FIGS. 31 and 32, for example, a silicon substrate 1 is prepared, and a buried insulating layer (e.g., silicon dioxide) 2 is formed in the silicon substrate 1. Here, the same thing as that in the example 1 can be applied to a silicon layer (fin) 3 on the buried insulating layer 2. That is, although the silicon layer 3 is formed on the buried insulating layer 2 in the drawing, this silicon layer 3 is originally a part of the silicon substrate 1.

A cap insulating layer (e.g., silicon nitride) 4 as a mask material is formed on the silicon substrate 1 (silicon layer 3 in the drawing) by LPCVD. Then, the cap insulating layer 4 is patterned by the photolithography and RIE, and the silicon substrate 1 (silicon layer 3 in the drawing) is etched with this cap insulating layer 4 being used as a mask by RIE. As a result, the silicon layer 3 is formed on the buried insulating layer 2.

Furthermore, an insulating layer 14 which completely covers the silicon layer 3 is formed on the buried insulating layer 2. Moreover, the insulating layer 14 is polished by CMP with the cap insulating layer 4 being used as a stopper, and a surface of the cap insulating layer 4 is made substantially the same as a surface of the insulating layer 14.

It is to be noted that a substrate having an insulating layer embedded in the silicon substrate from the beginning, e.g., an SIMOX substrate may be used as the SOI substrate. In this example, although the fin (silicon layer 3) is formed on the assumption of the SOI substrate, the SOI structure may be alternatively realized by forming the fin on a regular silicon substrate by the photolithography and RIE and then embedding the insulating layer.

Figure 33:
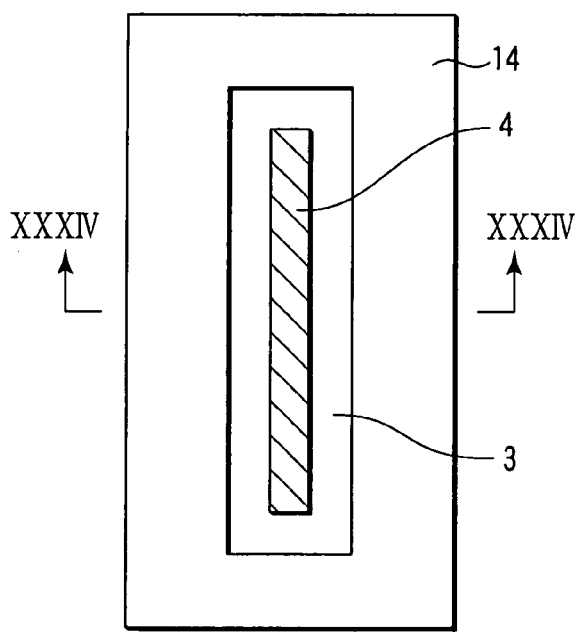
FIG. 33 is a view showing the second example of the manufacturing method according to the first embodiment.
Figure 34:
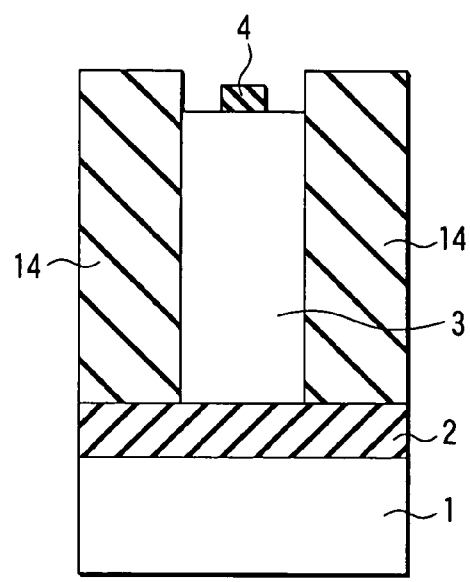
FIG. 34 is a cross-sectional view taken along the line XXXIV—XXXIV in FIG. 33.

Subsequently, as shown in FIGS. 33 and 34, the cap insulating layer 4 is etched by isotropic etching. As a result, a top face and side surfaces of the cap insulating layer 4 are isotropically etched, and a size of the cap insulating layer 4 is reduced.

Figure 35:
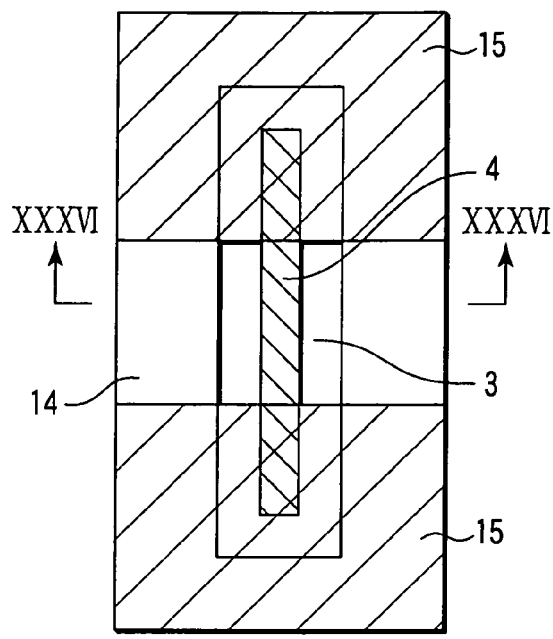
FIG. 35 is a view showing the second example of the manufacturing method according to the first embodiment.
Figure 36:
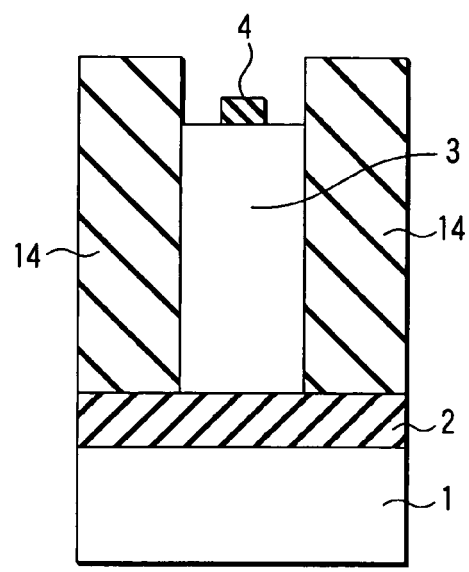
FIG. 36 is a cross-sectional view taken along the line XXXVI—XXXVI in FIG. 35.

Then, as shown in FIGS. 35 and 36, a resist layer 15 is formed by the photolithography. The resist layer 15 is patterned so as to have an opening on the upper portion of a channel area and a source/drain extension area of the silicon layer 3.

Figure 37:
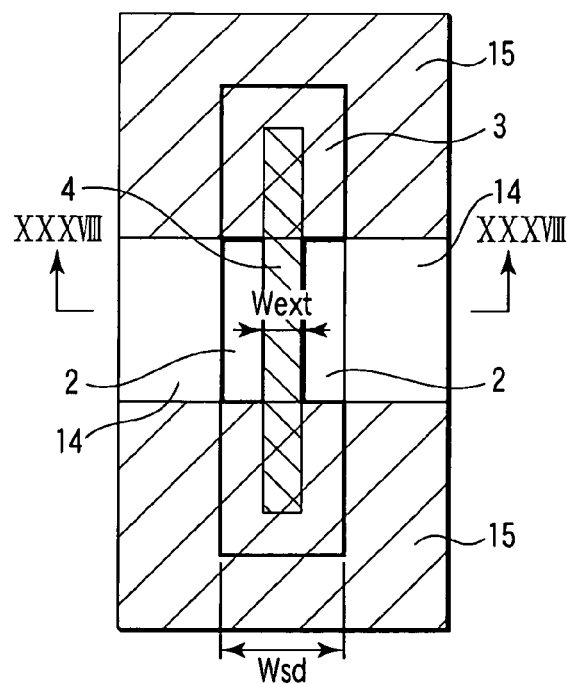
FIG. 37 is a view showing the second example of the manufacturing method according to the first embodiment.
Figure 38:
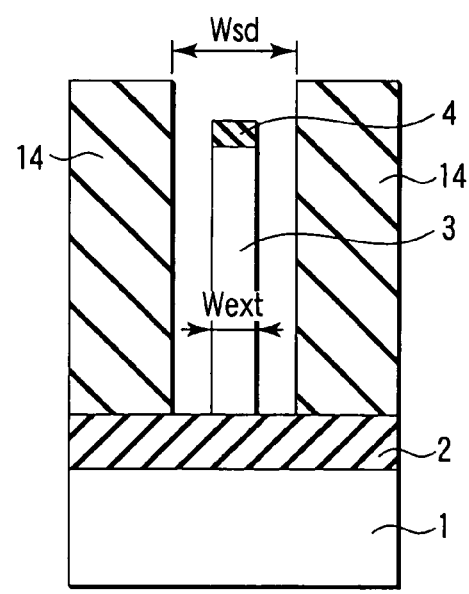
FIG. 38 is a cross-sectional view taken along the line XXXVIII—XXXVIII in FIG. 37.

Thereafter, as shown in FIGS. 37 and 38, when the silicon layer 3 is etched by RIE with the cap insulating layer 4, the insulating layer 14 and the resist layers 15 being used as masks, a width of the silicon layer 3 at a central portion becomes smaller than a width of the same at an end portion. Here, the central portion of the silicon layer 3 has a width Wext of the fin at a part where the source/drain extension area is formed, and the end portion of the silicon layer 3 has a width Wsd of the fin at a part where the source/drain area is formed (Wext<Wsd).

Figure 39:
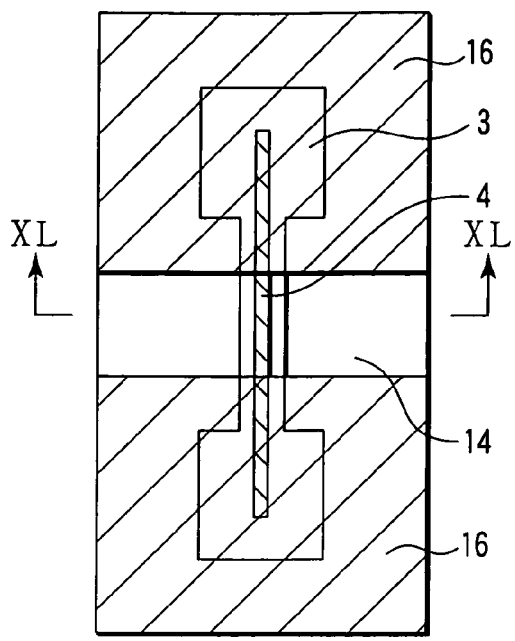
FIG. 39 is a view showing the second example of the manufacturing method according to the first embodiment.
Figure 40:
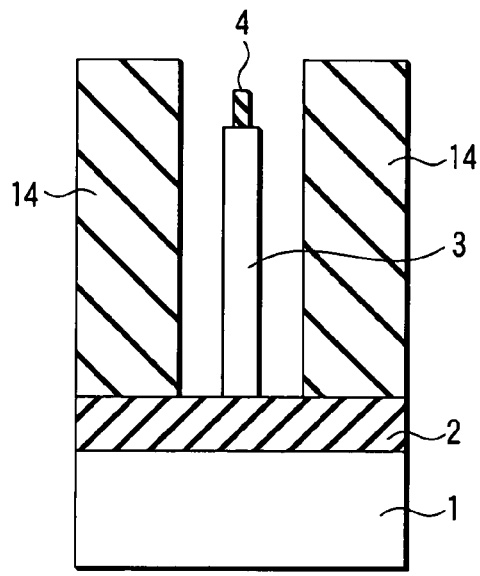
FIG. 40 is a cross-sectional view taken along the line XL—XL in FIG. 39.

Then, as shown in FIGS. 39 and 40, the cap insulating layer 4 is again etched by isotropic etching. As a result, the top face and the side surfaces of the cap insulating layer 4 are isotropically etched, and the size of the cap insulating layer 4 is further reduced. Thereafter, a resist layer 16 is formed by the photolithography. The resist layer 16 is patterned so as to have an opening at the upper portion of the channel area of the silicon layer 3.

Figure 41:
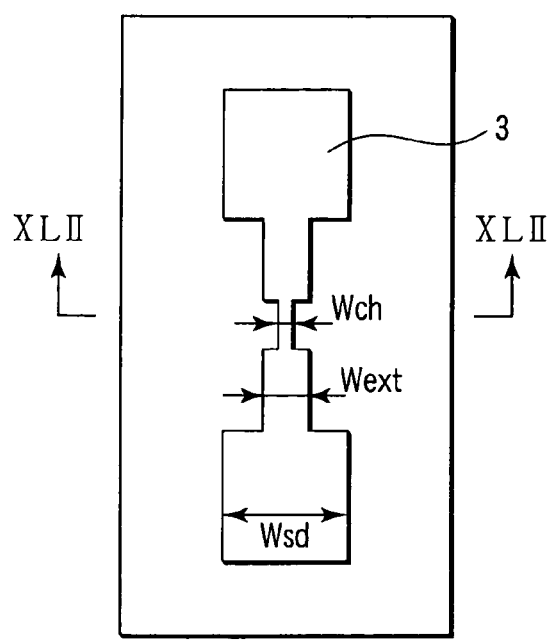
FIG. 41 is a view showing the second example of the manufacturing method according to the first embodiment.
Figure 42:
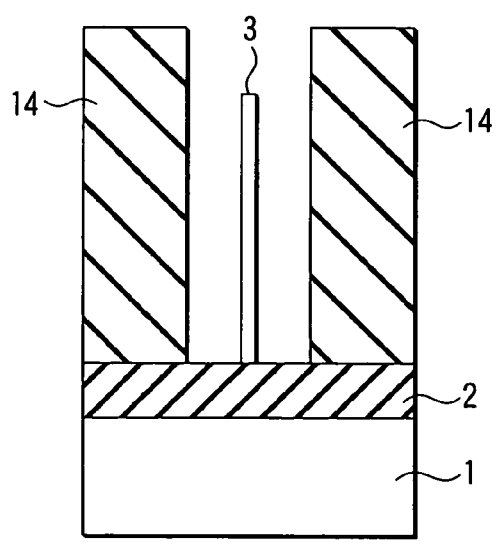
FIG. 42 is a cross-sectional view taken along the line XLII—XLII in FIG. 41.

Then, when the silicon layer 3 is again etched by RIE with the cap insulating layer 4, the insulating layer 14 and the resist layer 16 being used as masks, the width of the silicon layer 3 at the central part is further narrowed as shown in FIGS. 41 and 42. Here, the central portion of the silicon layer 3 has a width Wch of the fin at a part where the channel area is formed, and a relationship of Wch<Wext<Wsd can be obtained.

At last, when the insulating layer 14 is removed, the SOI substrate consisting of the silicon substrate 1, the buried insulating layer 2 and the silicon layer 3 having the above-described relationship is completed.

As subsequent processes, the same processes as those shown in FIGS. 17 to 30 are adopted for example, thereby bringing the FinFET to completion.

However, since the width of the channel area has been already narrowed by the processes shown in FIGS. 31 to 42, steps to narrow the width of the channel area, i.e., formation of the silicon dioxide layer 13 by thermal oxidation and stripping of the same in FIGS. 23 and 25 are eliminated in the processes of FIGS. 17 to 30.

3. Second Embodiment

First, the second embodiment relates to a structure and a manufacturing method which facilitate formation of a fin and also facilitate subsequent processing of members using the photolithography or the like by controlling an effective channel width of the FinFET based on the number of fins connected to each other in parallel in place of heights of the fins.

Second, this embodiment relates to a structure and a manufacturing method which prevent an area which is of an electroconductive type different from an electroconductive type of a source/drain area from partially remaining in the source/drain area in the FinFET having such a structure that a plurality of fins are connected to each other in parallel.

(1) Structure

FIGS. 43 and 44 show a structure of a FinFET according to a second embodiment of the present invention. FIG. 44 is a cross-sectional view taken along the like XLIV—XLIV in FIG. 43.

An insulating layer 2 is formed on a silicon substrate 1, and a fin-shaped silicon layer 3 is formed on the insulating layer 2. A so-called SOI substrate is constituted by the silicon substrate 1, the insulating layer 2 and the silicon layer 3.

The silicon layer 3 is constituted by a plurality of channel/extension portions (fins) and two source/drain portions provided in common with these channel/extension portions. The source/drain portion of the silicon layer 3 exists at each of both ends of a plurality of the channel/extension portions in a direction x, the channel/extension portions being aligned in a direction y. These channel/extension portions (fins) and the source/drain portions are electrically connected to each other, and they form a ladder shape on the whole when seen from a direction z.

Here, heights of a plurality of the fins constituting one FinFET are the same. Therefore, processing of the fins is very easy. Further, since irregularities of the insulating layer formed on the upper portions of the fins can be eliminated and the insulating layer can be flattened, subsequent processing of members using the photolithography or the like can be correctly performed.

Furthermore, an effective channel width of the FinFET is controlled by the number of fins connected to each other in parallel. That is, by changing the number of the fins connected to each other in parallel, a plurality of FinFETs having different effective channel widths can be formed in one LSI.

Cap insulating layer 4 used as masks when processing the silicon layer 3 are formed on a plurality of the channel/extension portions (fins) of the silicon layer 3. Gate electrodes 6 are formed on two side surfaces of each channel/extension portion of the silicon layer 3 in the direction y through gate insulating layers 5.

The device of this example has a structure that a plurality of the fins are connected to each other in parallel. Therefore, it is realistic that the gate electrode 6 on one side of each of a plurality of fins is electrically connected with the gate electrode 6 on the other side so as to cut across the silicon layer 3.

Sidewall insulating layers (sidewalls) 9 are formed on side surfaces of the gate electrodes 6 in the direction x. Areas in the silicon layer 3 sandwiched by the gate electrodes 6 are channel areas 7. Furthermore, in the silicon layer 3, source/drain areas 8 and source/drain extension areas 8a are formed on the both sides of the channel areas 7. A direction of a current flowing through each channel area 7 is a direction parallel to the surface of the silicon substrate 1, i.e., the direction x.

Silicide layers 11 are formed on the gate electrodes 6 and the source/drain areas 8, respectively. In this example, the silicide layers 11 are formed on the gate electrodes 6 and the source/drain areas 8 exposed to the opening portions of the insulating layers 12, i.e., the side surfaces and the top face of the silicon layer 3 exposed to the opening portions of the insulating layers 12.

In such a FinFET, "twofold of a height h of the silicon layer 3"×"number n of the fins (channel/extension portions)" is an effective gate width (effective channel width). That is, according to this structure, the effective channel width is determined based on the height h of the silicon layer 3 and the number of the fins.

A width of each fin in the direction y is not fixed, but it is gradually increased from the central portion toward the end portion on three stages.

That is, a width Wext of the silicon layer (fin) 3 in the source/drain extension area 8a is larger than a width of the silicon layer (fin) 3 in the channel area, i.e., a width Wch of the channel area. Moreover, a width Wsd of the silicon layer 3 in the source/drain area 8 is larger than a width Wext of the silicon layer (fin) 3 in the source/drain extension area 8a.

Therefore, by decreasing the width Wch of the channel area and, on the other hand, increasing the width Wsd of the silicon layer 3 in the source/drain area 8, an impurity concentration of the source/drain area 8 can be set sufficiently high and deep, thereby greatly reducing a parasitic resistance.

Additionally, assuming that a gate length of the gate electrode 6 is Lg, the width Wch of the channel area can be set smaller than the gate length Lg, thereby effectively suppressing the short channel effect.

Further, in case of the FinFET according to this embodiment, in the silicon layer 3 in the source/drain area 8 having the largest width Wsd, the source/drain area 8 is formed in the entire silicon layer 3. That is, an area which is of an electroconductive type opposite to an electroconductive type of the source/drain area 8 does not partially remain in the source/drain area 8.

(2) Manufacturing Method

An example of a manufacturing method for realizing a structure shown in FIGS. 43 and 44 will now be described.

Figure 45:
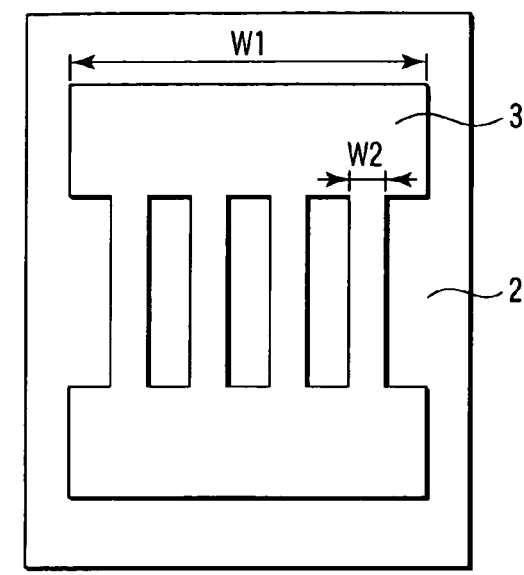
FIG. 45 is a view showing an example of the manufacturing method according to the second embodiment.

First, as shown in FIG. 45, a silicon layer (fin) 3 is formed on a buried insulating layer (e.g., silicon dioxide) 2 on a silicon substrate 1, for example. This silicon layer 3 is formed in the following manner for instance.

For example, oxygen ions are implanted into the silicon substrate, and a thermal process is conducted, thereby forming the buried insulating layer 2 in the silicon substrate. Then, a cap insulating layer as a mask material is formed on the silicon substrate by LPCVD. Then, the cap insulating layer is patterned by the photolithography and RIE, and the silicon substrate is etched by RIE with this cap insulating layer being used as a mask. As a result, the ladder-shaped silicon layer (fin) 3 is formed on the buried insulating layer 2.

Here, the silicon layer 3 is formed in such a manner that a width at a part which will be the source/drain area later is larger than a width W2 at a part which will be the channel/extension area later in order to reduce a parasitic resistance.

Figure 46:
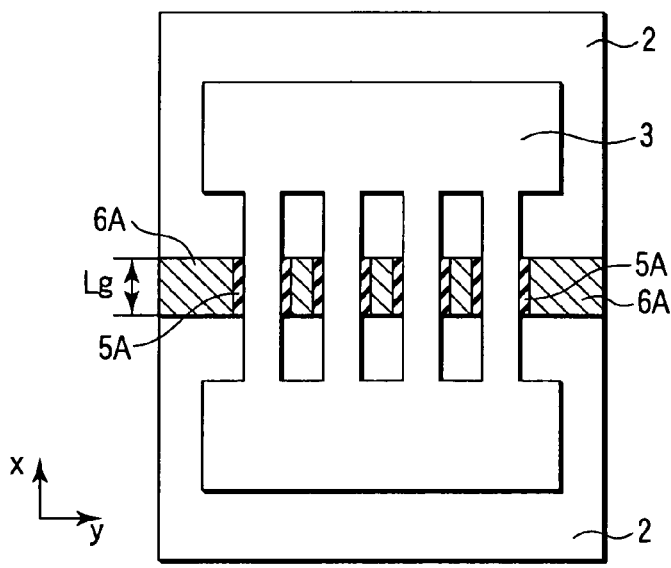
FIG. 46 is a view showing the example of the manufacturing method according to the second embodiment.

Then, as shown in FIG. 46, dummy gate insulating layers 5A are formed on side surfaces of the silicon layer 3 by, e.g., thermal oxidation, and polysilicon layers (dummy gate electrodes 6A in the drawing) are subsequently formed on the dummy gate insulating layers SA. Then, the top faces of the polysilicon layers are made substantially the same as the top face of the cap insulating layer 4 by CMP (flattening) with the cap insulating layer 4 being used as a stopper, for example.

Thereafter, the polysilicon layers are processed by the photolithography and RIE, and dummy gate electrodes 6A having a gate length Lg such as shown in the drawing are formed.

Figure 47:
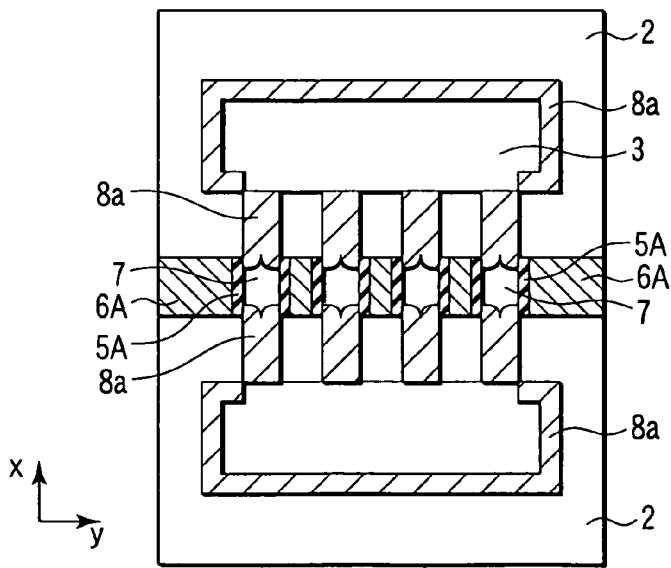
FIG. 47 is a view showing the example of the manufacturing method according to the second embodiment.

Then, as shown in FIG. 47, impurities are implanted into the surface area of the silicon layer 3 by tilted ion implantation (implantation angle θ is, e.g., $10° \leq θ \leq 30°$), and source/drain extension areas 8a are formed. Thereafter, silicon nitride which completely covers the silicon layer 3 is formed on the buried insulating layer 2 by, e.g., LPCVD. Then, this silicon nitride is etched by RIE, and sidewall insulating layers (sidewalls) are formed.

Although the sidewall insulating layers are respectively formed on sidewalls of the dummy gate electrodes 6A and sidewalls of the silicon layer 3, various conditions may be set in such a manner that the sidewall insulating layers are formed on only the sidewalls of the dummy gate electrodes 6A.

Figure 48:
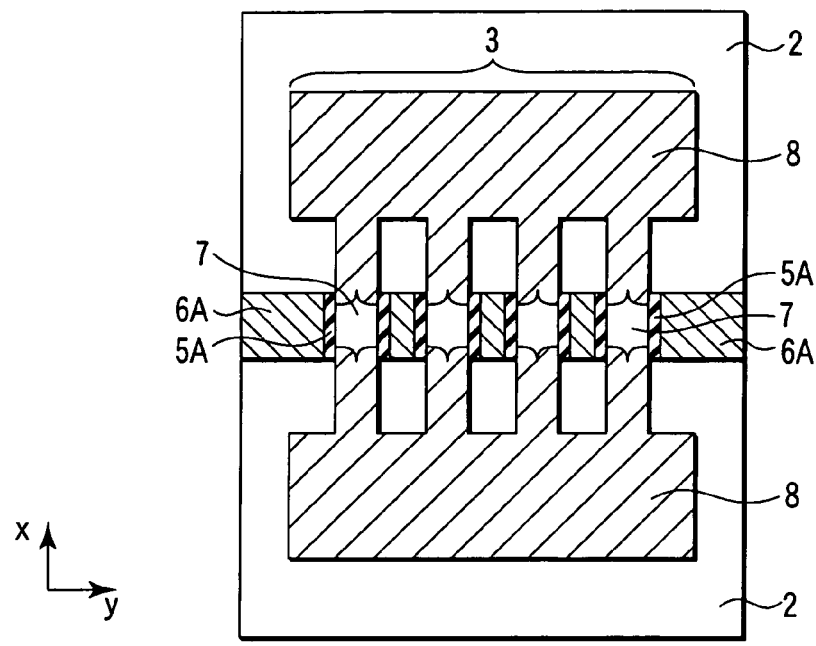
FIG. 48 is a view showing the example of the manufacturing method according to the second embodiment.

Then, as shown in FIG. 48, vertical (0° with respect to a plane vertical to the surface of the silicon substrate) ion implantation or tilted ion implantation at a low angle with respect to a plane vertical to the surface of the silicon substrate (e.g., an implantation angle θ is $0°<θ<10°$) is performed, and impurities are implanted into the surface area of the silicon layer 3. Subsequently, when activation of the impurities is performed, source/drain areas 8 are formed in the silicon layer 3.

Here, before the ion implantation for forming the source/drain areas, when impurities such as germanium (Ge) or silicon (Si) are ion-implanted at the same positions as those of the ion implantation, the source/drain areas 8 are amorphousized. In this case, after the ion implantation for the source/drain areas, when the impurities are activated by performing low-temperature annealing at approximately 600° C. (SPE (Solid Phase Epitaxial regrowth)), diffusion of the impurities constituting the source/drain areas 8 is suppressed, and hence diffusion of the impurities from the source/drain areas 8 to the source/drain extension areas 8a can be suppressed to the minimum level.

Moreover, after forming the sidewall insulating layers, the epitaxial growth may be carried out in order to form an epitaxial layer on the surface of the silicon layer 3.

Figure 49:
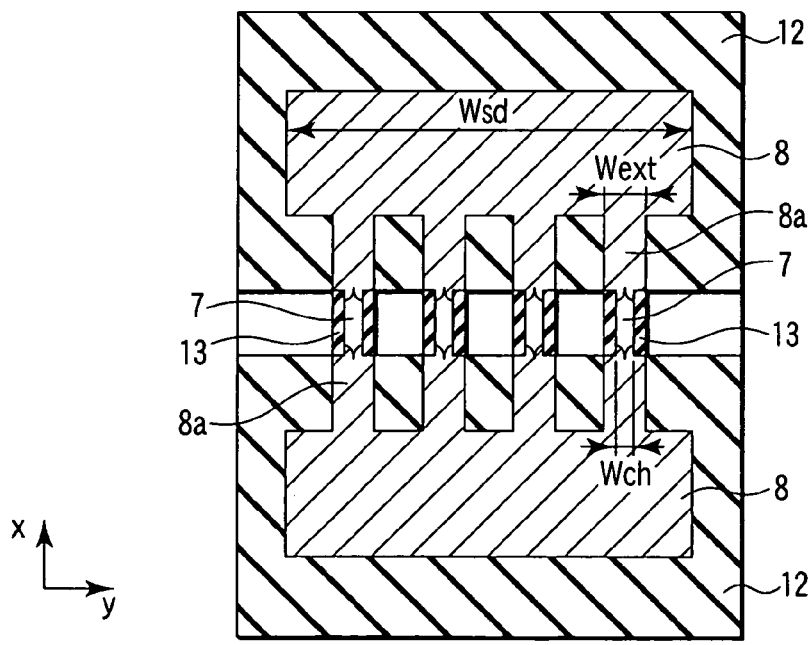
FIG. 49 is a view showing the example of the manufacturing method according to the second embodiment.

Then, as shown in FIG. 49, insulating layers (e.g., silicon dioxide) 12 which completely cover the silicon layer 3 are formed on the buried insulating layer 2. Subsequently, the insulating layers 12 are polished by CMP with the cap insulating layer 4 being used as a mask and the top faces of the insulating layers 12 are made substantially the same as the top face of the cap insulating layer 4 (flattening), for example.

As a result, the top faces of the dummy gate electrodes 6A (see FIG. 48) are exposed. Thereafter, when the dummy gate electrodes 6A and the dummy gate insulating layers 5A are removed, slit-like holes are formed at these parts, and the surface of the silicon layer 3 is partially exposed. Then, when the exposed silicon layer 3 is oxidized by thermal oxidation, silicon dioxide layers 13 are formed so as to bite into the silicon layer 3.

Thereafter, when the silicon dioxide layers 13 are selectively removed, concave portions are formed in the channel areas 7 of the silicon layer 3.

As a result, the width Wch of the channel area 7 is smaller than the width Wext of the fin in the source/drain extension area 8a. That is, assuming that Wsd is a width of the fin in the source/drain area 8, a relationship of Wch<Wext<Wsd can be obtained.

Consequently, an increase in a drive current due to a reduction in a parasitic resistance in the source/drain area 8 can be realized. Additionally, in this example, the width Wch of the channel area 7 can be readily made smaller than the gate length Lg without using the photolithography, which can contribute to suppression of the short channel effect.

Thereafter, by performing the same manufacturing steps as the manufacturing steps (FIGS. 26 to 30) in the above-described first embodiment, such a FinFET as shown in FIGS. 43 and 44 can be completed.

Further, although not shown, when an interlayer insulating layer, a contact, a wiring layer and others are thereafter formed by a regular wafer process, a semiconductor integrated circuit having an MIS type transistor is completed.

4. Third Embodiment

The third embodiment relates to a structure and a manufacturing method by which a large part or all of a source/drain area is not silicided in a FinFET having a silicide layer on the source/drain area.

(1) Structure

Three examples will now be sequentially described hereinafter.

① EXAMPLE 1

FIGS. 50 and 51 show a structural example 1 of a FinFET according to the third embodiment of the present invention. It is to be noted that FIG. 51 is a cross-sectional view taken along the line LI—LI in FIG. 50.

An insulating layer 2 is formed on a silicon substrate 1, and a fin-shaped silicon layer 3 which is long in a direction x and short in a direction y is formed on the insulating layer 2. A so-called SOI substrate is constituted by the silicon substrate 1, the insulating layer 2 and the silicon layer (fin) 3.

Gate electrodes 6 are formed on two side surfaces of the silicon layer 3 in a direction Y through gate insulating layers 5. In this example, although the gate electrode 6 on one side of the silicon layer 3 is electrically connected with the gate electrode 6 on the other side of the same so as to cut across the silicon layer 3, they may be separated from each other. Sidewall insulating layers (sidewalls) 9 are formed on side surfaces of the gate electrode 6 in a direction x.

An area in the silicon layer 3 sandwiched by the gate electrodes 6 is a channel area 17. Furthermore, in the silicon layer 3, source/drain areas 8 and source/drain extension areas 8a are formed on the both sides of the channel area 7. A direction of a current flowing through the channel area 7 is a direction parallel to the surface of the silicon substrate 1, i.e., a direction x.

Silicide layers 11 are formed on the gate electrodes 6 and the source/drain areas 8. In this example, the silicide layers 11 are respectively formed on the top face of the gate electrode 6 and the side surfaces and the top face of the silicon layer 3.

This FinFET is characterized in that the source/drain area 8 having a sufficient thickness exists between the silicide layers 11 formed on the surface of the silicon layer 3. Since the silicide layer 11 is formed by a reaction of the silicon layer and a metal layer, a thickness of the source/drain area 8 between the silicide layers 11 is determined by a thickness of the silicon layer 3, a thickness of the metal layer, a temperature and a time of silicidation and others.

In the worst case, all of the silicon layer 3 in the source/drain area 8 may be silicided. Since such a case should be avoided, a thickness of the silicide layer 11 in the direction y is set smaller than ½ of the thickness of the silicon layer 3 in the direction y.

Moreover, for example, as shown in FIG. 11, in cases where the end portion of the gate sidewall S-wall is formed so as to match with the end portion of the fin of the silicon layer 3, when a width a from an angular portion of the fin positioned at the farthest end to an angular portion of a square coupling part which connects a plurality of fins is smaller than a thickness of the silicide layer, since silicidation proceeds from the top face and the side surfaces of the coupling part, the fin positioned at the farthest end is silicided, thereby increasing a parasitic resistance.

Thus, a design is made in advance in such a manner that the width a from the angular portion of the fin positioned at the farthest end to the angular portion of the coupling part which connects a plurality of the fins is larger than the thickness of the silicide layer in order to prevent the silicide layer from being formed to the fin positioned at the farthest end.

② EXAMPLE 2

FIGS. 52 and 53 show a structural example 2 of the FinFET according to the third embodiment of the present invention. It is to be noted that FIG. 53 is a cross-sectional view taken along the line LIII—LIII in FIG. 52.

An insulating layer 2 is formed on a silicon substrate 1, and a silicon layer 3 which is long in a direction x and short in a direction y is formed on the insulating layer 2. A so-called SOI substrate is constituted by the silicon substrate 1, the insulating layer 2 and the silicon layer (fin) 3.

Gate electrodes 6 are formed on two side surfaces of the silicon layer 3 in a direction y through gate insulating layers 5. In this example, although the gate electrode 6 on one side of the silicon layer 3 is electrically connected with the gate electrode 6 on the other side of the same so as to cut across the silicon layer 3, they may be separated from each other. Sidewall insulating layers (sidewalls) 9 are formed on side surfaces of the gate electrode 6 in a direction x.

An area in the silicon layer 3 sandwiched by the gate electrodes 6 is a channel area 7. Further, source/drain areas 8 and source/drain extension areas 8a are formed on both sides of the channel area 7. A direction of a current flowing through the channel area 7 is a direction parallel to the surface of the silicon substrate 1, i.e., the direction x.

Silicide layers 11 are formed on the gate electrodes 6 and the source/drain areas 8. In this example, the silicide layers 11 are respectively formed on the top faces of the gate electrodes 6 and the side surfaces and top face of the silicon layer 3.

This FinFET is characterized in that the source/drain areas 8 between the silicide layers 11 are widely assured as compared with the FinFET of the structural example 1. That is, in this example, a width of the source/drain area 8 in a direction y is substantially the same as a width of the original silicon (fin) 3.

Such a structure can be readily obtained by selectively growing the silicon layer on the source/drain areas 8 by using, e.g., a so-called elevated source/drain technique and then performing silicidation. Naturally, widths of the source/drain area 8 and the silicide layer 11 are determined by a width of the silicon layer 3, a thickness of a metal layer, a temperature and a time of silicidation and others.

③ EXAMPLE 3

Figure 54:
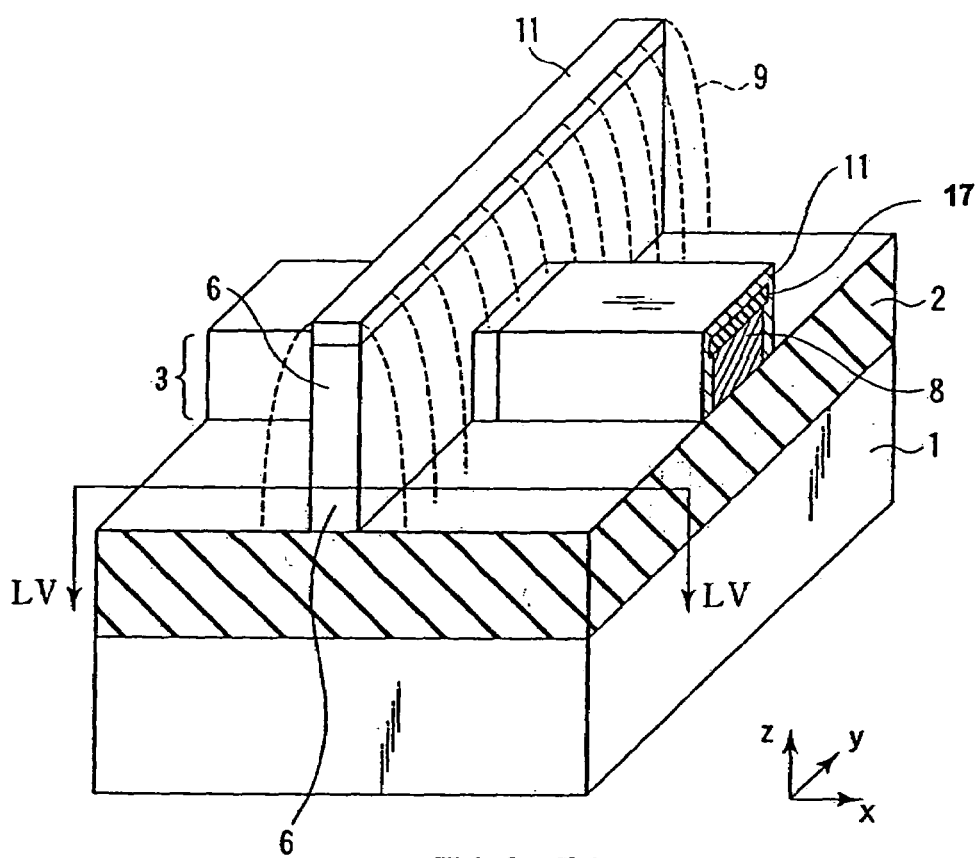
FIG. 54 is a view showing a structural example 3 of the FinFET according to the third embodiment of the present invention.
Figure 55:
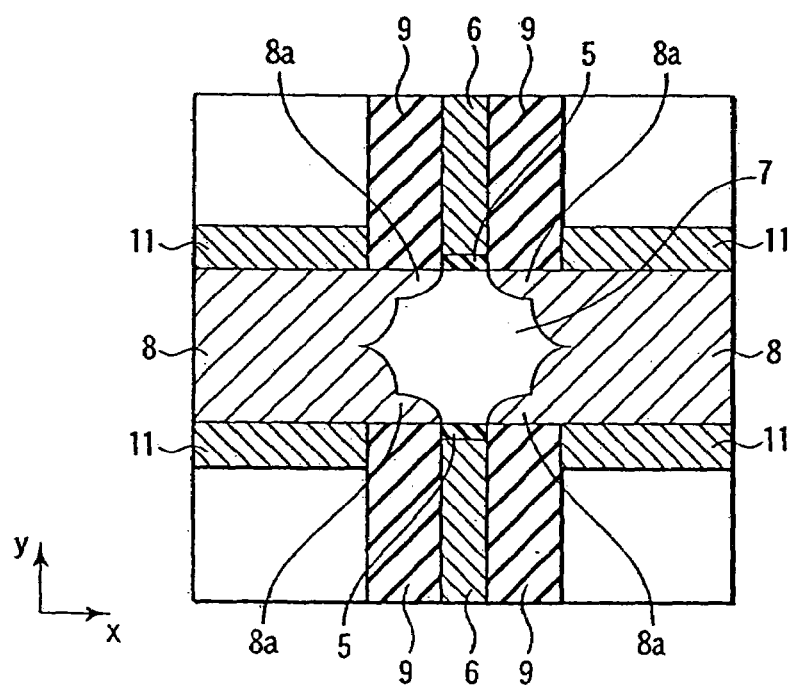
FIG. 55 is a cross-sectional view taken along the line LV—LV in FIG. 54.

FIGS. 54 and 55 show a structural example 3 of the FinFET according to the third embodiment of the present invention. It is to be noted that FIG. 55 is a cross-sectional view taken along the line LV—LV in FIG. 54.

An insulating layer 2 is formed on a silicon substrate 1, and a fin-shaped silicon layer 3 which is long in a direction x and short in a direction y is formed on the insulating layer 2. A so-called SOI substrate is constituted by the silicon substrate 1, the insulating layer 2 and the silicon layer (fin) 3.

Gate electrodes 6 are formed on two side surfaces of the silicon layer 3 in a direction y through gate insulating layers 5. In this example, although the gate electrode 6 on one side of the silicon layer 3 is electrically connected with the gate electrode 6 on the other side of the same so as to cut across the silicon layer 3, they may be separated from each other. Sidewall insulating layers (sidewalls) 9 are formed on side surfaces of the gate electrodes 6 in a direction x.

An area in the silicon layer 3 sandwiched by the gate electrodes 6 is a channel area 7. Moreover, in the silicon layer 3, source/drain areas 8 and source/drain extension areas 8a are formed on both sides of the channel area 7. A direction of a current flowing through the channel area 7 is a direction parallel to the surface of the silicon substrate 1, i.e., a direction x.

Silicide layers 11 are formed on the gate electrodes 6 and the source/drain areas 8. In this example, the silicide layers 11 are formed on the top faces of the gate electrodes 6, the side surfaces of the silicon layer 3 and the top face of the silicon layer 3.

Here, a silicidation stopper (e.g., silicon dioxide) 17 used to suppress silicidation of the silicon layer 3 is formed between the silicide layer 11 formed on the upper portion of the top face of the silicon layer 3 and the silicon layer 3. Therefore, the sufficiently large source/drain areas 8 can be assured between the silicide layers 11.

④ OTHERS

Although one FinFET has one fin in the examples 1 to 3, one FinFET may be constituted by, e.g., a plurality of fins connected to each other in parallel.

(2) Manufacturing Method

Examples of a manufacturing method for realizing the three structures shown in FIGS. 50 and 55 will now be described.

① EXAMPLE 1

This example concerns a manufacturing method for realizing the structure shown in FIGS. 50 and 51.

First, as shown in FIG. 56, for example, a silicon substrate 1 is prepared, and a buried insulating layer (e.g., silicon dioxide) 2 is formed in the silicon substrate 1. Although a silicon layer (fin) 3 is formed on the buried insulating layer 2 in the drawing, this silicon layer 3 is originally a part of the silicon substrate 1.

A cap insulating layer 4 as a mask material is formed on the silicon substrate 1 (silicon layer 3 in the drawing) by, e.g., LPCVD. Then, the cap insulating layer 4 is patterned by the photolithography and RIE, and the silicon substrate 1 is etched by RIE with this cap insulating layer 4 being used as a mask. As a result, the silicon layer 3 is formed on the buried insulating layer 2.

It is to be noted that the cap insulating layer 4 is constituted by a stacked structure of silicon dioxide and silicon nitride.

The fin (silicon layer 3) is formed on the assumption of the SOI substrate in this example. However, in place of this structure, an insulating layer may be formed on a regular silicon substrate, a silicon layer may further formed on the insulating layer, and then a fin may be formed by the photolithography and RIE.

Figure 57:
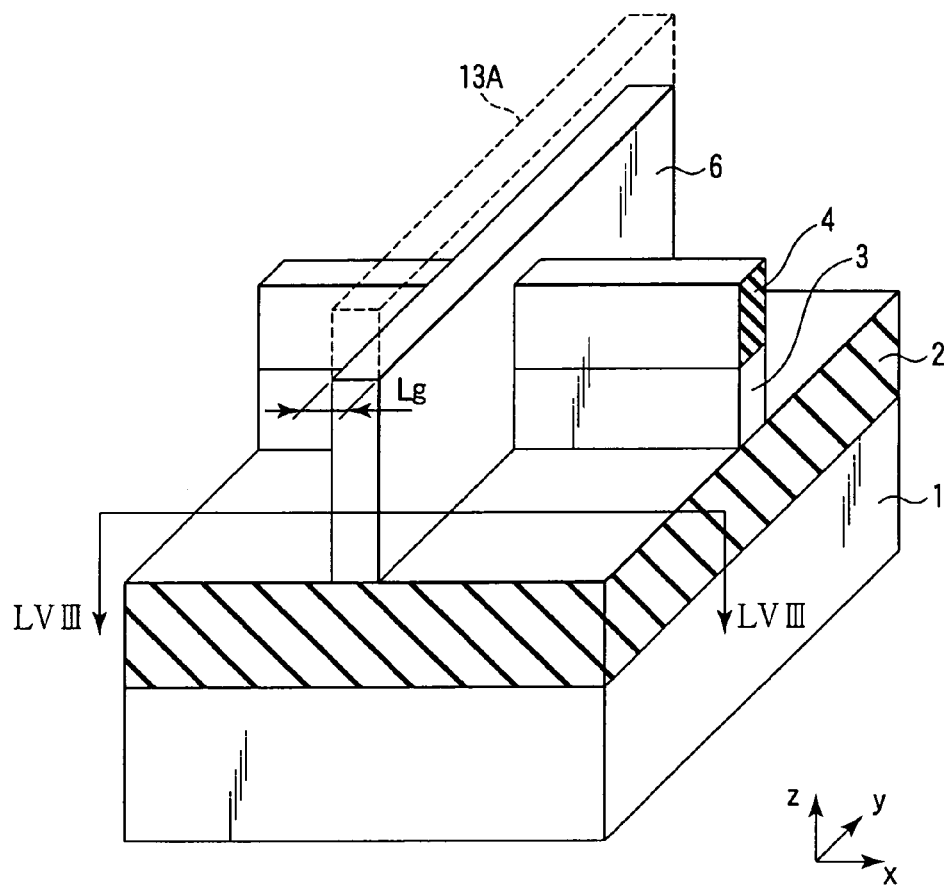
FIG. 57 is a view showing the first example of the manufacturing method according to the third embodiment.
Figure 58:
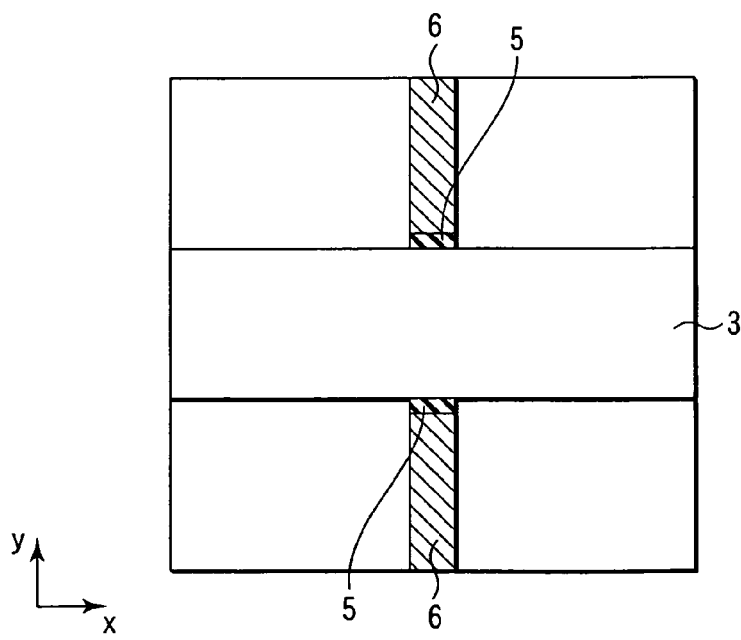
FIG. 58 is a cross-sectional view taken along the line LVIII—LVIII in FIG. 57.

Subsequently, as shown in FIGS. 57 and 58, gate insulating layers 5 are formed on side surfaces of the silicon layer 3 by, e.g., thermal oxidation, and then polysilicon layers (gate electrodes 6 in the drawing) are formed on the gate insulating layers 5 by LPCVD. Further, a cap insulating layer (e.g., silicon dioxide, silicon nitride and others) 13A is formed on the polysilicon layers by LPCVD.

Then, the cap insulating layer 13A is patterned by, e.g., the photolithography and RIE. Furthermore, the polysilicon layers are processed by RIE with the cap insulating layer 13A being used as a mask, and a gate electrode 6 having a gate length Lg such as shown in the drawing is formed.

Incidentally, when forming the gate electrode 6, CMP may be executed immediately after the polysilicon layer which is a base of the gate electrode 6 is formed in order to flatten the polysilicon layer.

Moreover, as to the gate electrode 6, a metal such as tungsten (W) or molybdenum (Mo) may be used in place of polysilicon. When the metal is used for the gate electrode 6 in this manner, so-called depletion of the gate electrode is not generated, which can contribute to an improvement in a drive current.

Figure 59:
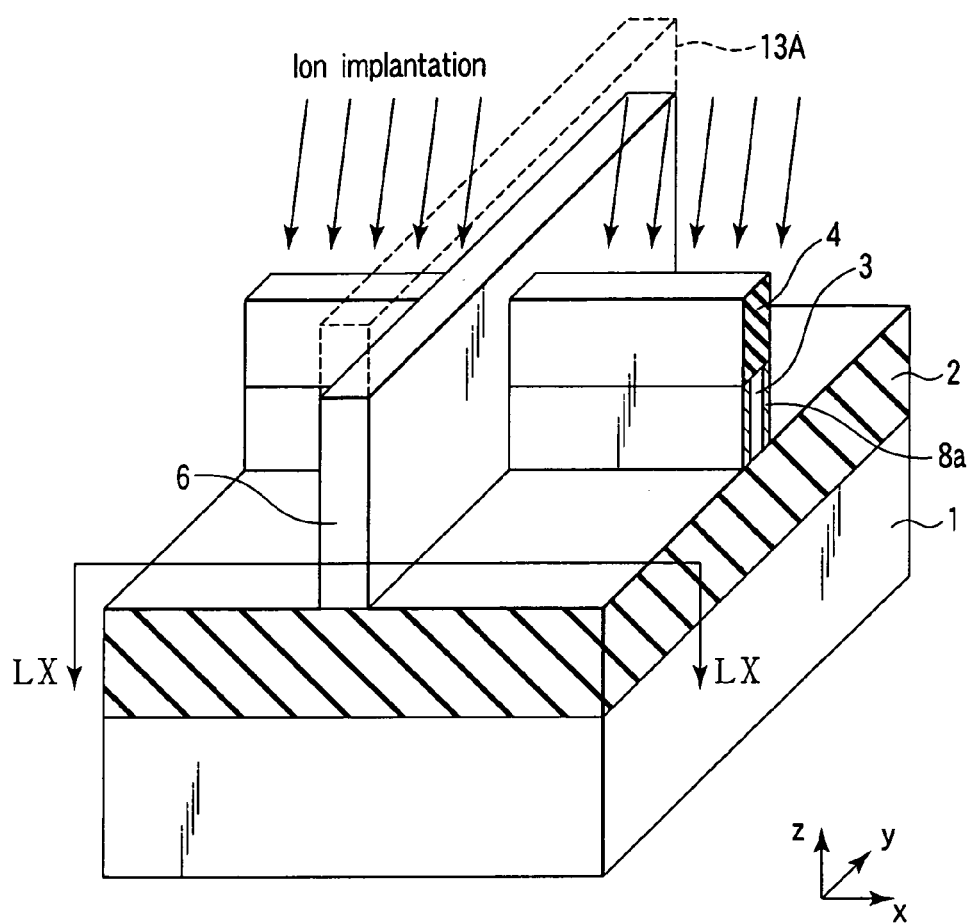
FIG. 59 is a view showing the first example of the manufacturing method according to the third embodiment.
Figure 60:
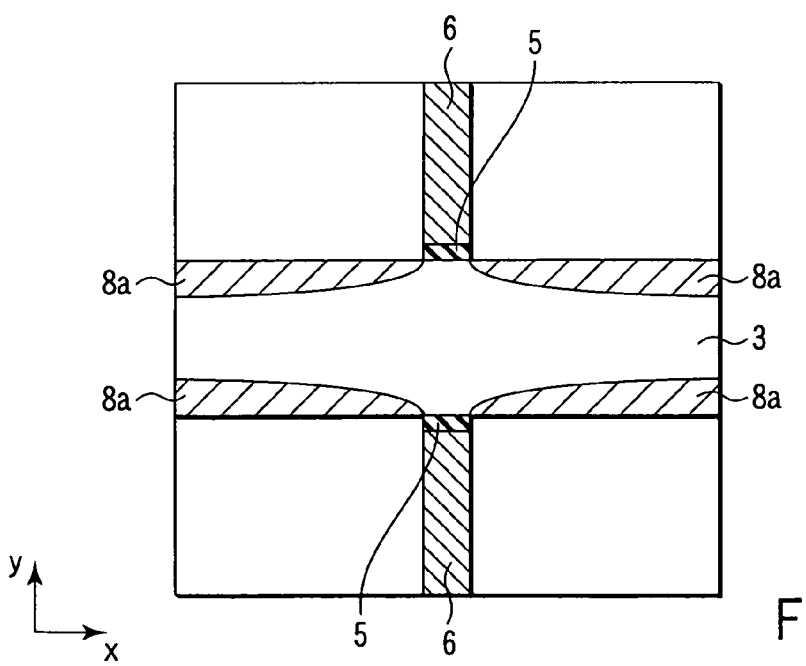
FIG. 60 is a cross-sectional view taken along the line LX—LX in FIG. 59.

Then, as shown in FIGS. 59 and 60, impurities are implanted into the surface area of the silicon layer 3 by tilted ion implantation (implantation angle $\theta$ is, e.g., $10°\leq\theta\leq30°$), and the impurities are activated by a thermal process, thereby forming source/drain extension areas 8a. The source/drain extension areas 8a are formed on, e.g., side surfaces of the silicon layer 3 in a direction y.

Thereafter, the cap insulating layer 4 on the silicon layer 3 and the cap insulating layer 13A on the gate electrode 6 are respectively removed. For example, when the cap insulating layers 4 and 13A are formed of silicon nitride, the cap insulating layers 4 and 13A are removed by using a phosphoric acid heated to approximately 160° C. Additionally, when the cap insulating layers 4 and 13A are formed of silicon dioxide, the cap insulating layers 4 and 13A are removed by a hydrofluoric acid.

Figure 61:
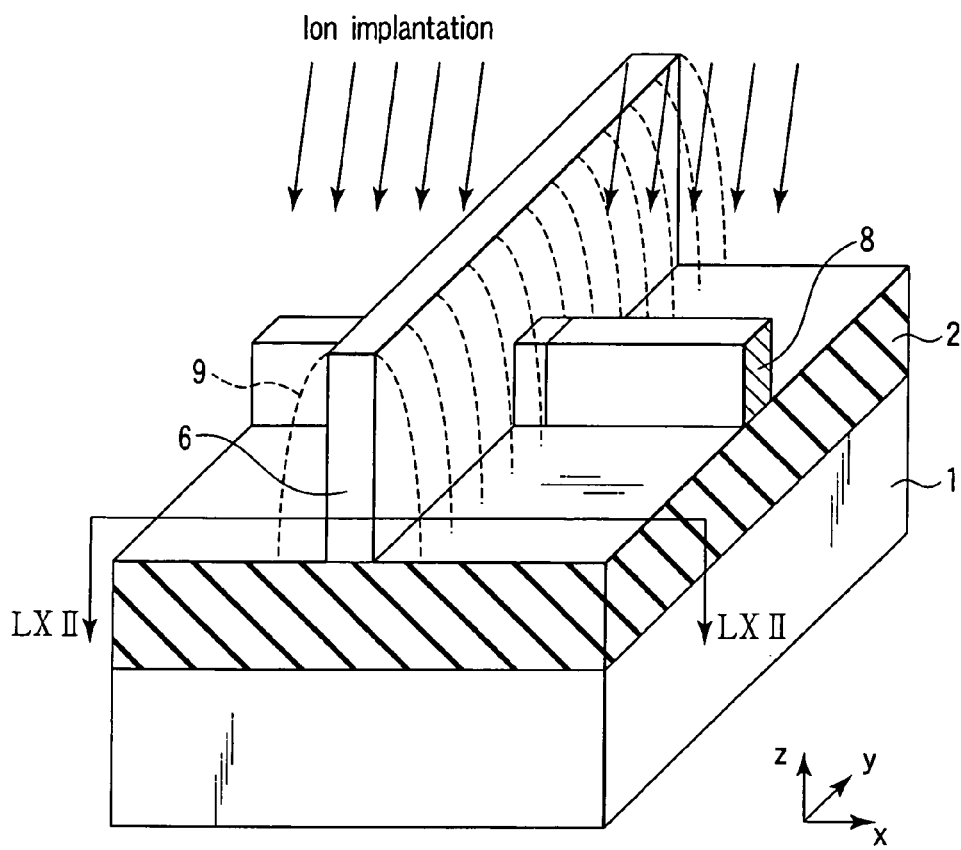
FIG. 61 is a view showing the first example of the manufacturing method according to the third embodiment.
Figure 62:
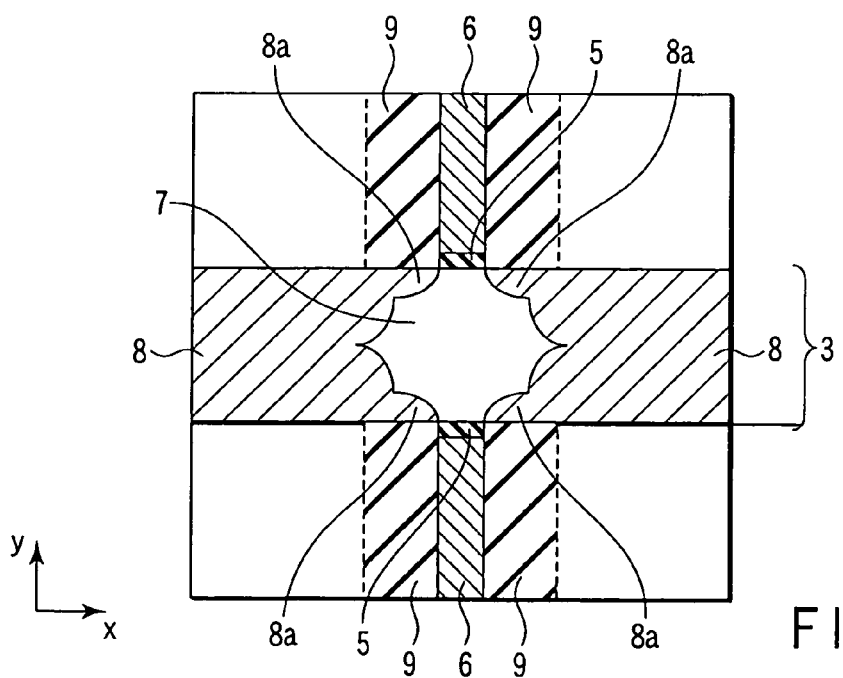
FIG. 62 is a cross-sectional view taken along the line LXII—LXII in FIG. 61.

Subsequently, as shown in FIGS. 61 and 62, silicon nitride which completely covers the silicon layer 3 is formed on the buried insulating layer 2 by, e.g., LPCVD. Then, this silicon nitride is etched by RIE, and sidewall insulating layers (sidewalls) 9 are formed.

Here, an etching time is adjusted in such a manner that the sidewall insulating layers 9 are formed on only the sidewalls of the gate electrode 6 and they are not formed on the sidewalls of the silicon layer 3.

Thereafter, impurities are again implanted into the silicon layer 3 by vertical ion implantation at a low angle (implantation angle $\theta$ is, e.g., $0°<\theta\leq10°$) or vertical ion implantation (implantation angle $\theta$ is $0°$), and the impurities are activated by a thermal process, thereby forming source/drain areas 8.

The source/drain areas 8 are formed in the entire silicon layer 3 except the channel area 7.

Figure 63:
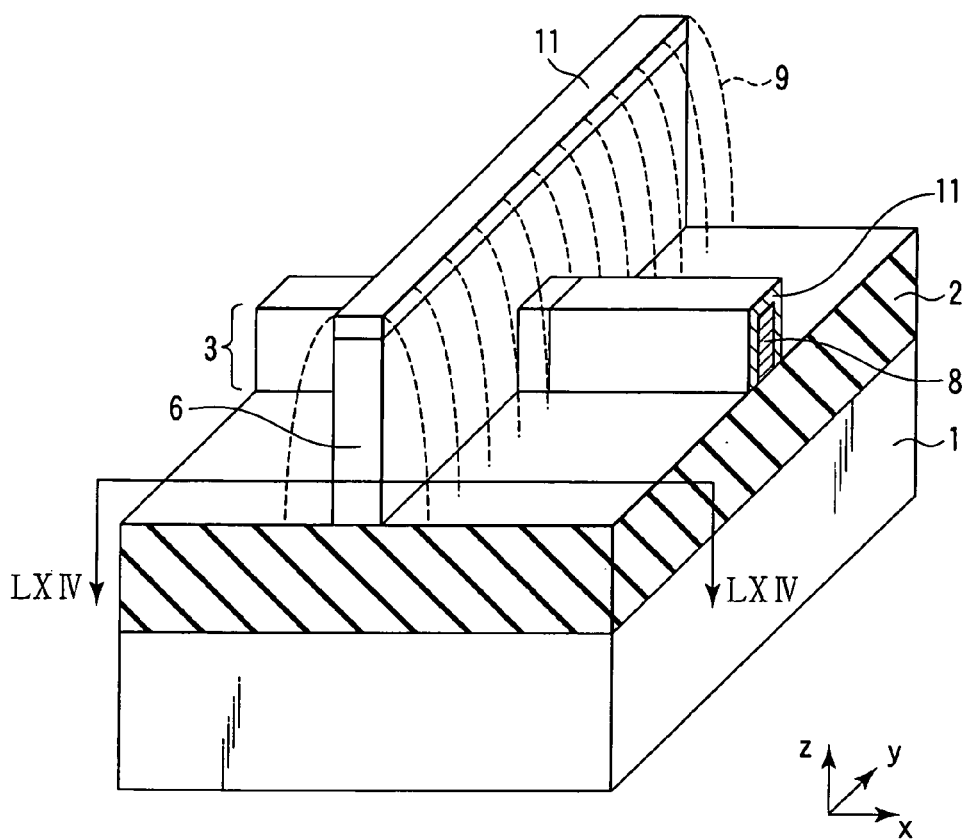
FIG. 63 is a view showing the first example of the manufacturing method according to the third embodiment.
Figure 64:
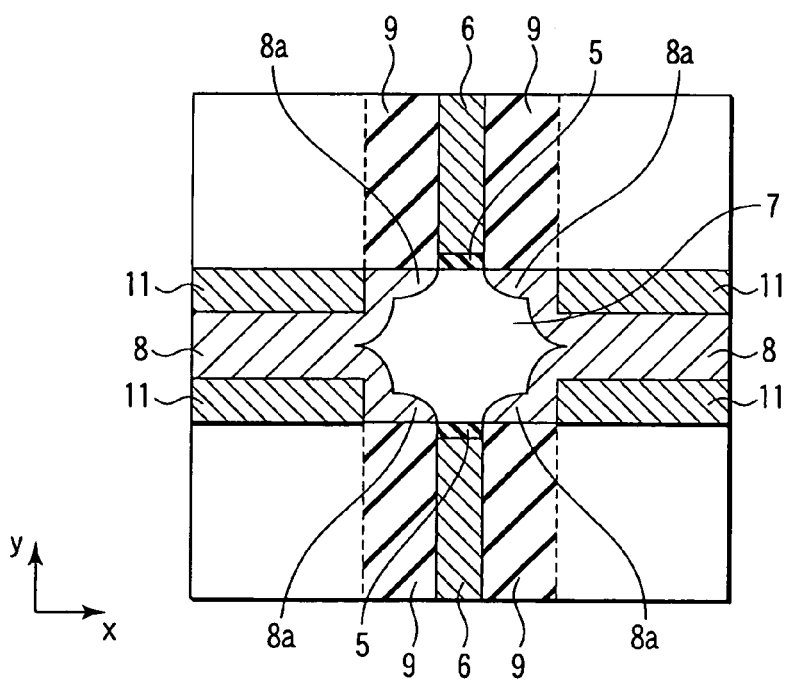
FIG. 64 is a cross-sectional view taken along the line LVIV—LVIV in FIG. 63.

Subsequently, as shown in FIGS. 63 and 64, a metal layer which covers the top face and the side surfaces of the silicon layer 3 and the top face of the gate electrode 6, e.g., a metal layer consisting of nickel (Ni), cobalt (Co), titanium (Ti), palladium (Pd) or the like is formed, and a thermal process is performed.

As a result, metal silicide layers 11 are respectively formed on the top faces and the side surfaces of the source/drain areas 8 and the top faces of the gate electrodes 6. Furthermore, thereafter, the metal layers which have not been converted into the metal silicide layers 11 are removed.

Incidentally, when performing such silicidation, a thickness of the silicon layer 3, a thickness of the metal layers and conditions of silicidation (a time, a temperature and others) are controlled in such a manner that all of the silicon layer 3 excluding the channel area 7 is not converted into the silicide layers 11.

By the above-described steps, such a FinFET as shown in FIGS. 50 and 51 is completed.

Thereafter, although not shown, when an interlayer insulating layer, a contact, a wiring layer and others are formed by a regular wafer process, a semiconductor integrated circuit having an MIS type transistor is completed.

② EXAMPLE 2

This example relates to a manufacturing method for realizing a structure shown in FIGS. 52 and 53.

First, a silicon layer (fin) 3, gate insulating layers 5 and a gate electrode 6 are formed by the same method as that of the above-described example 1. Like the example 1, the gate electrode 6 may be constituted by either polysilicon or a metal (see FIGS. 56 to 51).

Figure 65:
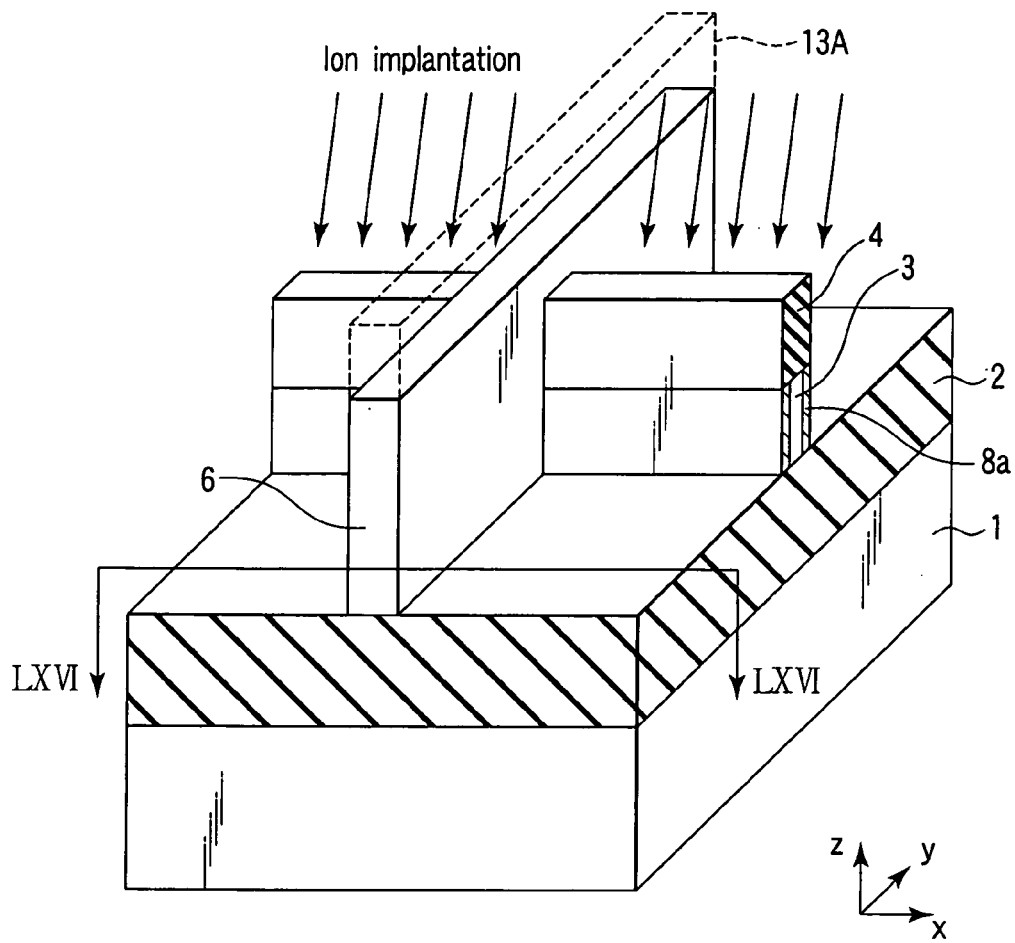
FIG. 65 is a view showing a second example of the manufacturing method according to the third embodiment.
Figure 66:
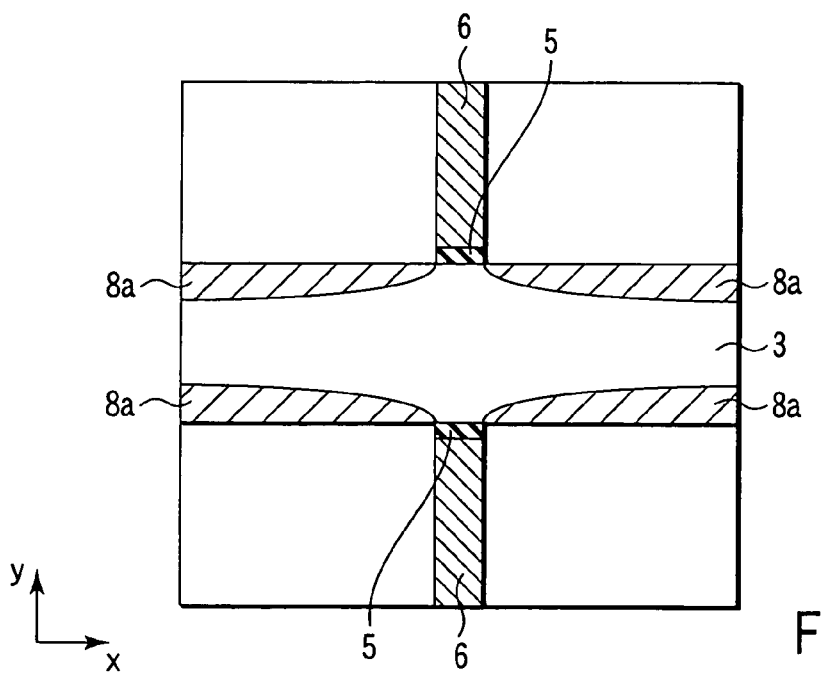
FIG. 66 is a cross-sectional view taken along the line LXVI—LXVI in FIG. 65.

Then, as shown in FIGS. 65 and 66, impurities are implanted into the surface area of the silicon layer 3 by tilted ion implantation (implantation angle $\theta$ is, e.g., $10°\leq\theta\leq30°$), and the impurities are activated by a thermal process, thereby forming source/drain extension areas 8a. The source/drain extension areas 8a are formed on, e.g., the side surfaces of the silicon layer 3 in a direction y.

Thereafter, cap insulating layers 4 on the silicon layer 3 and a cap insulating layer 13A on the gate electrode 6 are respectively removed. For example, when the gap insulating layers 4 and 13A are constituted by silicon nitride, the cap insulating layers 4 and 13A are removed by a phosphoric acid. Moreover, when the cap insulating layers 4 and 13A are constituted by silicon dioxide, the cap insulating layers 4 and 13A are removed by a hydrofluoric acid.

Subsequently, as shown in FIGS. 67 and 68, silicon nitride which completely covers the silicon layer 3 is formed on the buried insulating layer 2 by, e.g., LPCVD. Then, this silicon nitride is etched by RIE, thereby forming sidewall insulating layers (sidewalls) 9.

Here, an etching time is adjusted in such a manner that the sidewall insulating layers 9 are formed on only the sidewalls of the gate electrode 6 and not formed on the sidewalls of the silicon layer 3.

Thereafter, a semiconductor layer 15A formed of, e.g., silicon or silicon germanium is selectively grown on the exposed surface of the silicon layer (fin) 3 in advance in such a manner that all of the source/drain areas are not silicided in silicidation, and a thickness of the silicon layer 3 is increased.

It is to be noted that, when the gate electrode 6 is formed of polysilicon, the semiconductor layer 15A formed of silicon, silicon germanium or the like may be selectively formed on the gate electrode 6 simultaneously with formation of the counterpart on the silicon layer 3.

A selective growth of silicon (monocrystal silicon) can be readily carried out by heating the silicon substrate in a hydrogen atmosphere in a temperature range of, e.g., 700° C. to 900° C. and supplying a reactant gas such as SiH4, SiH2Cl2, SiHCl3 or HCl to the silicon substrate together with hydrogen.

A selective growth of silicon germanium (monocrystal silicon germanium) can be readily executed by heating the silicon substrate in a hydrogen atmosphere in a temperature range of, e.g., 550° C. to 850° C. and supplying a reactant gas such as GeH4, GeH2Cl2, GeHCl3 or HCl to the silicon substrate together with hydrogen.

A technique which forms the semiconductor layer 15A on the silicon layer 3 by the selective growth and increases a thickness of the silicon layer (fin) 3 is referred to as an elevated source/drain technique.

Figure 69:
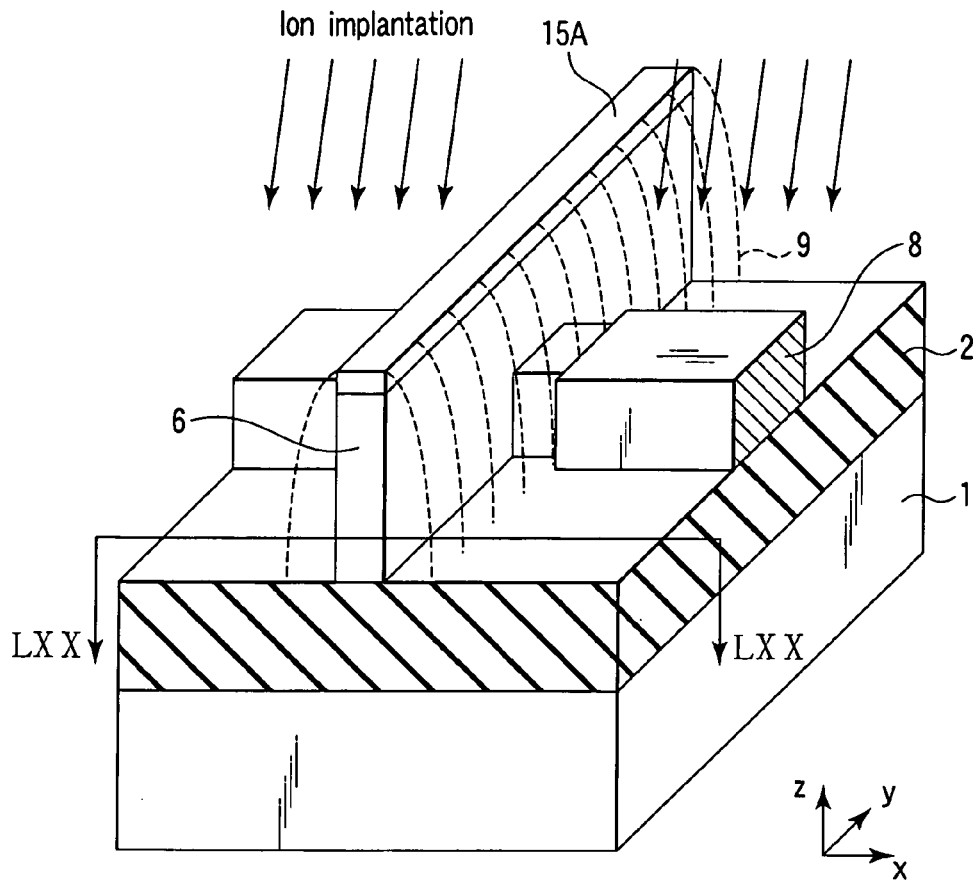
FIG. 69 is a view showing the second example of the manufacturing method according to the third embodiment.
Figure 70:
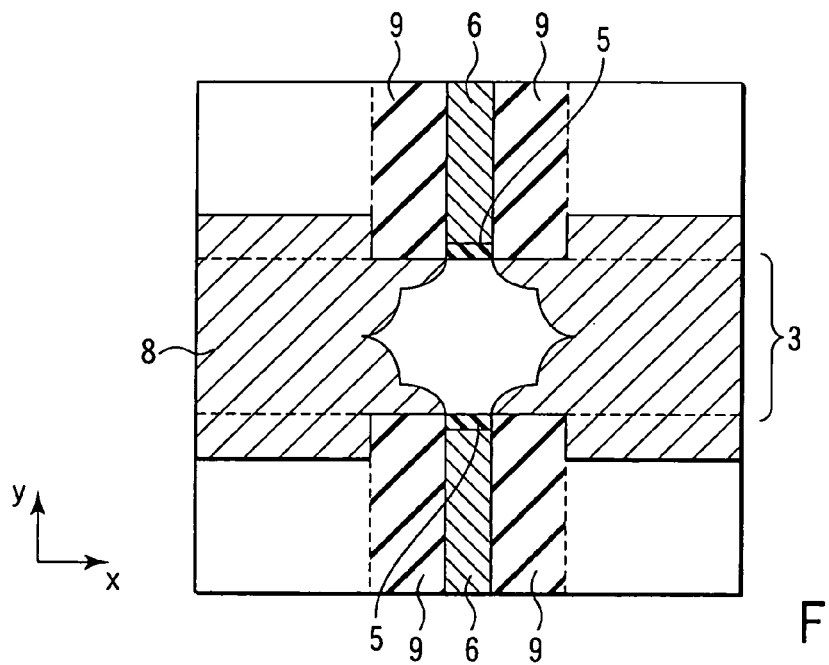
FIG. 70 is a cross-sectional view taken along the line LXX—LXX in FIG. 69.

Subsequently, as shown in FIGS. 69 and 70, impurities are implanted into the silicon layer 3 by tilted ion implantation at a low angle (implantation angle θ is, e.g., 0°<θ≦10°) or vertical ion implantation (implantation angle θ is 0°), and the impurities are activated by a thermal process, thereby forming source/drain areas 8.

The source/drain areas 8 are formed in the entire silicon layer 3 except the channel area 7.

Figure 71:
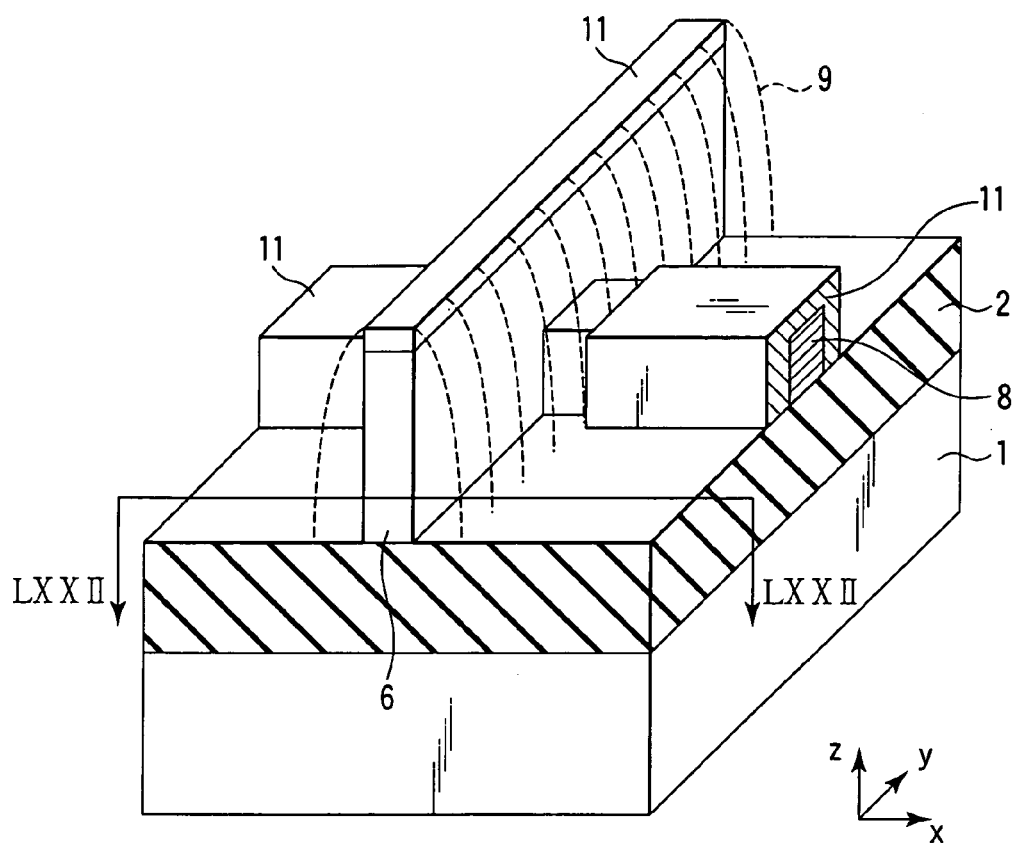
FIG. 71 is a view showing the second example of the manufacturing method according to the third embodiment.
Figure 72:
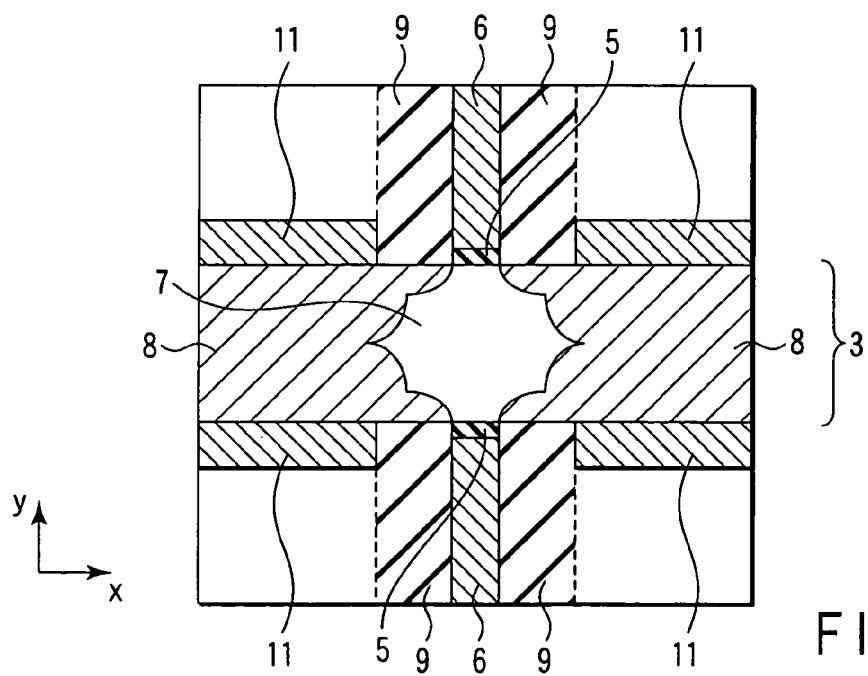
FIG. 72 is a cross-sectional view taken along the line LXXII—LXXII in FIG. 71.

Then, as shown in FIGS. 71 and 72, a metal layer which covers the top face and the side surfaces of the silicon layer 3 and the top face of the gate electrode 6, e.g., a metal layer consisting of nickel (Ni), cobalt (Co), titanium (Ti), palladium (Pd) or the like is formed, and a thermal process is performed.

As a result, metal silicide layers 11 are respectively formed on the top face and the side surfaces of the source/drain areas 8 and the top face of the gate electrode 6. Additionally, thereafter, the metal layers which have not been converted into the metal silicide layers 11 are removed.

Since a thickness of the silicon layer (fin) 3 is increased in advance by the selective growth in this silicidation, all of the silicon layer 3 is not converted into the silicide layer 11. That is, since the semiconductor layer 15A functions as consumption silicon in silicidation, the source/drain area 8 with a sufficient thickness remains between the silicide layers 11.

It is to be noted that a thickness of the silicide layer 11 is controlled based on a thickness of the silicon layer 3, a thickness of the metal layer and conditions (a time, a temperature and others) of silicidation.

By the above-described steps, such a FinFET as shown in FIGS. 52 and 53 is completed.

Thereafter, although not shown, when an interlayer insulating layer, a contact, a wiring layer and others are formed by a regular wafer process, a semiconductor integrated circuit having an MIS type transistor is completed.

③ EXAMPLE 3

This example relates to a manufacturing method for realizing a structure illustrated in FIGS. 54 and 55.

Before explaining the manufacturing method for realizing the structure of FIGS. 54 and 55, a brief description will be first given as to a regular manufacturing method and its problems.

Figure 73:
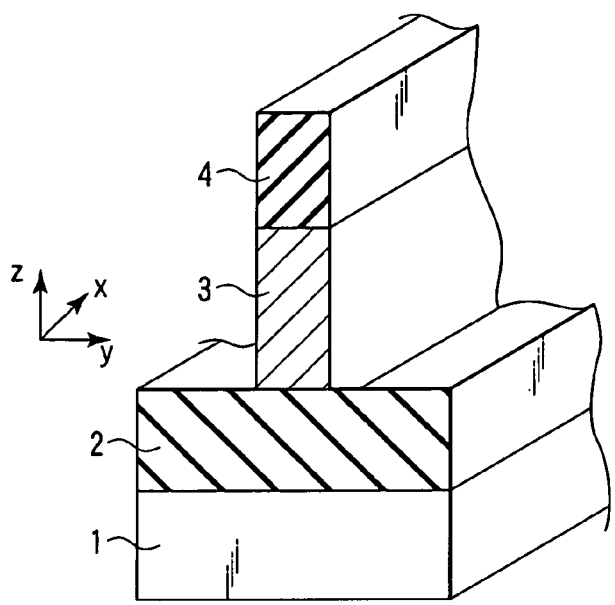
FIG. 73 is a view showing a third example of the manufacturing method according to the third embodiment.

First, as shown in FIG. 73, an SOI structure consisting of, e.g., a silicon substrate 1, a buried insulating layer (e.g., silicon dioxide) 2 and a silicon layer 3 is formed.

A cap insulating layer 4 as a mask material is formed on the silicon substrate 1 (silicon layer 3 in the drawing) by, e.g., LPCVD. Then, the cap insulating layer 4 is patterned by the photolithography and RIE, and the silicon substrate 1 is etched by RIE with this cap insulating layer 4 being used as a mask. As a result, the silicon layer (fin) 3 is formed on the buried insulating layer 2, thereby obtaining the SOI structure.

Thereafter, for example, by the same method as those of the example 1 and the example 2, the gate insulating layer, the gate electrode, source/drain extension area, the source/drain area and others are formed. Further, the cap insulating layer 4 on the silicon layer 3 is removed.

Figure 74:
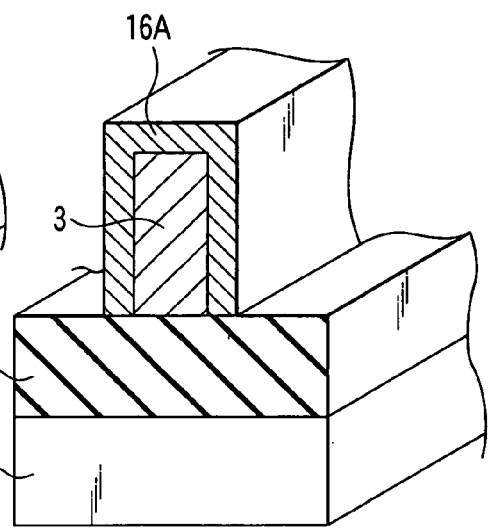
FIG. 74 is a view showing the third example of the manufacturing method according to the third embodiment.

Then, as shown in FIG. 74, a metal layer 16A which covers the surface of the silicon layer (source/drain areas) 3, e.g., a metal layer consisting of nickel (Ni), cobalt (Co), titanium (Ti), palladium (Pd) or the like is formed, and a thermal process is performed.

Figure 75:
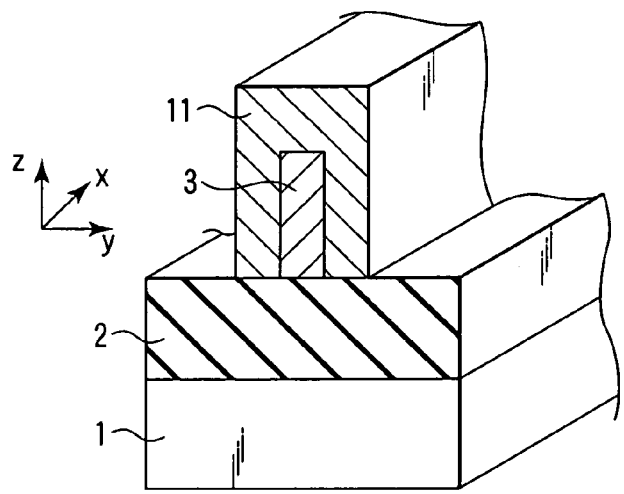
FIG. 75 is a view showing the third example of the manufacturing method according to the third embodiment.

As a result, as shown in FIG. 75, metal silicide layers 11 are respectively formed on the top face and the side surfaces of the silicon layer (source/drain areas) 3. It is to be noted that the metal layers which have not been converted into the metal silicide layers 11 are removed.

In this method, silicidation proceeds from the top face and the side surfaces of the silicon layer 3 toward the inside of the same. Therefore, it is hard to control an amount of the silicon layer 3 which is left after silicidation, and that amount is very small. This increases a sheet resistance of the silicon layer (source/drain areas) 3 between the silicide layers 11, which prevents a high-speed operation.

Thus, in the example 3, the following manufacturing method is proposed.

Figure 76:
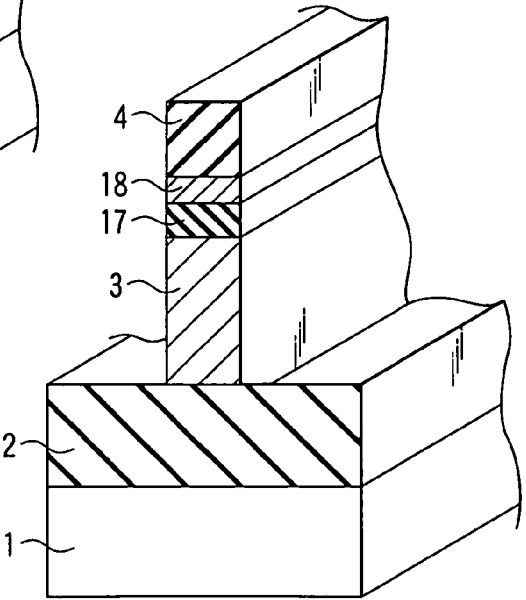
FIG. 76 is a view showing the third example of the manufacturing method according to the third embodiment.

First, as shown in FIG. 76, for example, a silicon substrate 1 is prepared, and a buried insulating layer (e.g., silicon dioxide) 2 is formed in this silicon substrate 1. In the drawing, although the silicon layer (fin) 3 is formed on the buried insulating layer 2, this silicon layer 3 is originally a part of the silicon substrate 1.

For example, a silicidation stopper (e.g., silicon dioxide, silicon nitride or the like) 17, a polysilicon layer 18 and a cap insulating layer 4 as a mask material are sequentially formed on the silicon substrate 1 (silicon layer 3 in the drawing) by LPCVD. Furthermore, thereafter, the cap insulating layer 4, the polysilicon layer (which may be alternatively an amorphous silicon layer) 18 and the silicidation stopper 17 are patterned by the photolithography and RIE, and the silicon substrate 1 is etched by RIE with the cap insulating layer 4 being used as a mask. Consequently, the silicon layer (fin) 3 is formed on the buried insulating layer 2.

Then, for example, by the same method as those of the example 1 and the example 2, a gate insulating layer, a gate electrode, source/drain extension areas., source/drain areas and others are formed.

Figure 77:
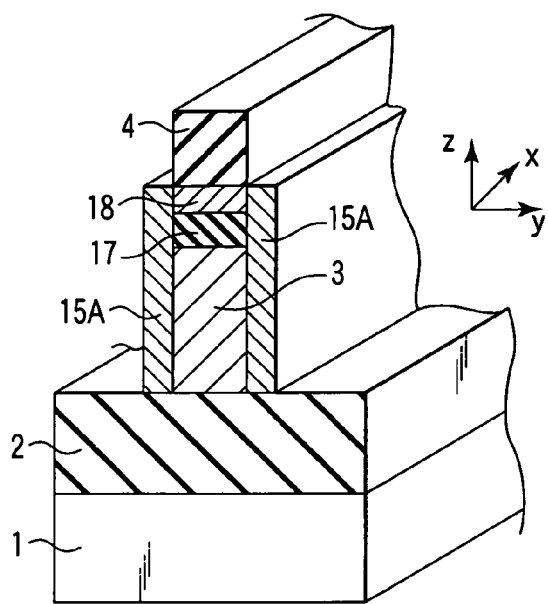
FIG. 77 is a view showing the third example of the manufacturing method according to the third embodiment.

In this example, however, as shown in FIG. 77, before forming the source/drain areas, epitaxial layers (a silicon layer, a silicon germanium layer or the like) 15A are grown on the side surfaces of the silicon layer 3 and the polysilicon layer 18 by the selective growth like the example 2.

Here, the epitaxial layers 15A grow from the side surfaces of the silicon layer 3 and from the side surfaces of the polysilicon layer 18. That is, the epitaxial layer 15A growing from the silicon layer 3 and the epitaxial layer 15A growing from the polysilicon layer 18 are coupled and integrated with each other on the side surfaces of the silicidation stopper 17.

Thereafter, the cap insulating layer 4 on the polysilicon layer 18 is removed. For example, when the cap insulating layer 4 is constituted by silicon nitride, the cap insulating layer 4 is removed by a phosphoric acid heated to approximately 160° C. Furthermore, when the cap insulating layer 4 is constituted by silicon dioxide, the cap insulating layer 4 is removed by a hydrofluoric acid.

Figure 78:
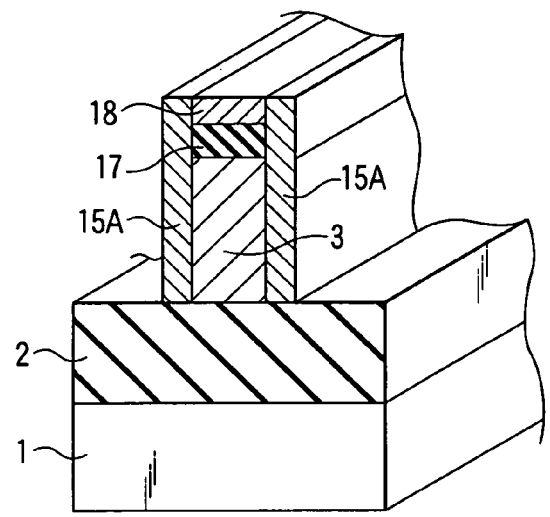
FIG. 78 is a view showing the third example of the manufacturing method according to the third embodiment.

Then, as shown in FIG. 78, after forming sidewall insulating layers (sidewalls), impurities are implanted into the silicon layer 3 and the epitaxial layers 15A by tilted ion implantation at a low angle (implantation angle θ is, e.g., 0°<θ≦10°) or vertical ion implantation (implantation angle θ is 0°), and the impurities are activated by a thermal process, thereby forming the source/drain areas.

Moreover, a metal layer which covers the side surfaces of the epitaxial layers 15A and the top face of the polysilicon layer 18, e.g., a metal layer consisting of nickel (Ni), cobalt (Co), titanium (Ti), palladium (Pd) or the like is formed, and a thermal process is performed.

Figure 79:
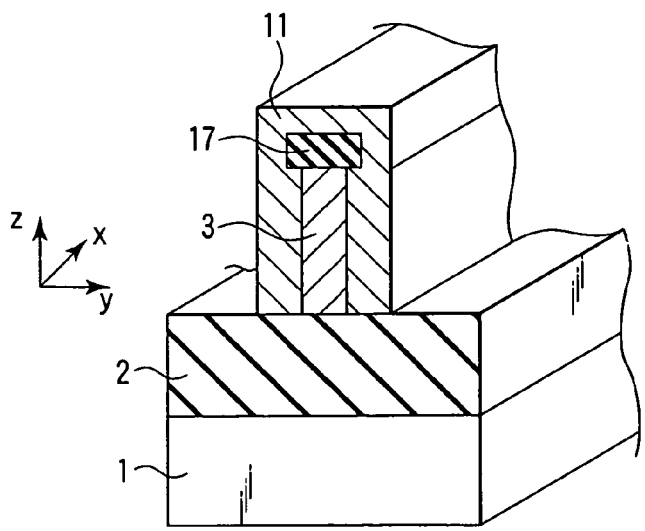
FIG. 79 is a view showing the third example of the manufacturing method according to the third embodiment.

As a result, as shown in FIG. 79, the metal silicide layer 11 is formed on the side surfaces of the silicon layer (source/drain areas) 3. Additionally, thereafter, the metal layers which have not been converted into the metal silicide layers 11 are removed.

Incidentally, when performing such silicidation, in the first place, since the silicidation stopper 17 exists on the silicon layer 3, silicidation does not proceed from the upper portion of the silicon layer 3. That is, since silicidation advances only from the side surfaces of the silicon layer 3, the silicon layer 3 is not completely silicided.

Further, in the second place, since the epitaxial layer 15A functions as consumption silicon in silicidation, the silicon layer (source/drain areas) 3 with a sufficient width can be left in the area between the silicide layers 11.

In the third place, the epitaxial layer 15A is formed so as to surround the silicidation stopper 17. That is, the silicon layer 3 and the polysilicon layer 18 are coupled with each other through the epitaxial layer 15A. As a result, the silicide layer 11 is also formed on the upper portion and the side surfaces of the silicon layer (fin) 3 so as to surround the silicon layer (fin) 3, and hence a sheet resistance of the silicide layer 11 can be reduced. Furthermore, achieving contact on the top face is enabled by this process.

By the above-described steps, such a FinFET as shown in FIGS. 54 and 55 is completed.

Thereafter, although not shown, when an interlayer insulating layer, a contact, a wiring layer and others are formed by a regular wafer process, a semiconductor integrated circuit having an MIS type transistor is completed.

5. Others

The FinFET according to the examples of the present invention is superior in suppression of the short channel effect since the width of the channel area is smaller than the gate length. Moreover, increasing the width of the source/drain extension area and the width of the source/drain area can reduce a parasitic resistance. Since the width of the source/drain extension area is equal to or larger than the gate length, processing of the fin by the photolithography and RIE is enabled.

By making the width of the source/drain extension area smaller than the width of the source/drain area, the source/drain extension area which overlaps the end portion of the gate electrode can be formed shallow. When the width of the source/drain area is larger than the width of the source/drain extension area, the source/drain area has a high impurity concentration and can be formed at a position deeper than that of the source/drain extension area, thereby reducing the parasitic resistance.

By independently arranging the gate electrodes placed on the right and left sides of the fin, a threshold voltage of the FinFET can be controlled by supplying a control signal to one of the gate electrodes positioned on the right and left sides of the fin, for example. When a plurality of fins are connected to each other in parallel and a plurality of channel areas are provided, the effective gate (channel) width of the FinFET can be adjusted based on the number of the fins connected to each other in parallel rather than heights of the fins. In this case, since the heights of the fins can be made equal to each other, the surface of the insulating layer formed on the upper portions of the fins can be flattened, and subsequent processing of the members can be correctly performed by the photolithography.

By forming the source/drain areas based on a combination of tilted ion implantation and vertical ion implantation, an area which is of an electroconductive type different from that of the source/drain area does not partially remain in the source/drain area.

When forming the FinFET, using the SOI substrate can improve insulation properties between transistors. Moreover, since a plurality of FinFETs (fins) are electrically completely separated from each other by the buried insulating layer, punchthrough between the source and the drain can be suppressed. On the other hand, when the silicon substrate is used, since a plurality of the FinFETs are not separated from each other by an insulating layer with a low thermal conductivity, a degradation in a drive current due to a self-heating effect can be suppressed.

The cap insulating layer (mask material) formed on the upper portion of the fin functions as a stopper in flattening processing based on, e.g., CMP. A thickness by which a process margin can be maintained is required in this cap insulating layer. When the gate electrode is also formed on the upper portion of the fin, the punchthrough between the source and the drain can be suppressed by forming sufficiently thick cap insulating layer arranged between the top face of the fin and the gate electrode.

When a fully depleted type FinFET is manufactured and an impurity concentration of the silicon substrate is set low, effects such as a low subthreshold slope, high mobility, a low-junction leak current can be obtained. The width of the channel area can be readily reduced by, e.g., formation and stripping of an oxide layer. Since an electric field at the end portion of the gate electrode is weakened, the reliability is also improved.

When the metal silicide layer is formed on the surfaces of the source/drain areas, the parasitic resistance of the source/drain areas is reduced in such a manner all or almost all of the source/drain areas are not converted into the metal silicide layers. Since the heights of all the fins formed on the insulating layer can be set equal to each other, the photolithography and RIE can be facilitated in formation of the fins, formation of the gate electrode and any other processing steps of the members.

The process can be simplified by continuously or gradually changing the width of the fin in the channel area, the width of the fin in the source/drain extension area and the width of the fin in the source/drain area, and forming the gate insulating layer and the gate electrode on such a fin.

The parasitic resistance can be reduced by forming the metal silicide layers on the gate electrode and the surface of the source/drain area. By using the dummy gate electrode and the dummy gate insulating layer, processes such as a reduction in the width of the fin in the channel area, formation of the gate insulating layer, formation of the gate electrode and others can be performed in the self-alignment manner. When the gate electrode of the FinFET is formed of a metal, the gate depletion does not occur, thereby improving a drive current.

In a fin type MISFET formed on the silicon substrate or the SOI substrate, by preventing all of the fin silicon in the source/drain area from being silicided, an increase in the sheet resistance of the diffusion layer immediately below the silicide layer can be suppressed, thus reducing the parasitic resistance. When all of the fin silicon in the source/drain area is prevented from being silicided by forming the epitaxial layer by the selective growth and increasing the thickness of the fin, since this epitaxial layer functions as consumption silicon in silicidation, restrictions in the thickness of the fin or the thickness of the silicide layer can be eased.

By providing the silicidation stopper consisting of, e.g., silicon dioxide on the upper part of the fin silicon, since silicidation does not proceed from the upper portion of the fin silicon in silicidation, the source/drain area with a sufficient thickness can be left between the silicide layers. Further, since the polysilicon layer is also formed on the silicidation stopper, the silicide layer surrounds the fin silicon, thereby further reducing the parasitic resistance.

6. Industrial Applicability

The semiconductor device and its manufacturing method according to the examples of the present invention are useful for a semiconductor integrated circuit having a three-dimensional element (MISFET) such as a FinFET in particular.

7. Advantages

According to the examples of the present invention, it is possible to provide a structure and a manufacturing method of a three-dimensional element such as a FinFET in which the width Wch of the channel area is smaller than the gate length Lg, the width Wext of the fin in the source/drain extension area is equal to or larger than the width Wch of the channel area, and the width Wsd of the fin in the source/drain area in the direction y is larger than the width Wch of the channel area and the width Wext of the fin in the source/drain extension area in the direction y.

Furthermore, according to the examples of the present invention, with the structure in which a plurality of fins are connected to each other in parallel, the effective channel width can be controlled based on the number of the fins rather than heights of the fins. Moreover, even if such a structure is adopted, it is possible to provide a structure and a manufacturing method by which an area which is of an electroconductive type different from an electroconductive type of the source/drain area does not partially remain in the source/drain area.

Additionally, according to the examples of the present invention, in regard to the silicide layer provided on the source/drain area in the fin, since it is possible to realize a structure and a manufacturing method by which a large part of the source/drain area is not silicided, the sheet resistance of the diffusion layer immediately below silicide can be prevented from being increased, thereby suppressing an increase in the parasitic resistance.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor device comprising:
   a semiconductor substrate;
   a fin-shaped semiconductor layer which is formed on the semiconductor substrate, is long in a first direction and is short in a second direction crossing the first direction;
   a gate insulating layer formed on side surfaces of the semiconductor layer in the second direction;
   a gate electrode arranged so as to be adjacent to the gate insulating layer;
   a channel area formed at a position adjacent to the gate insulating layer in the semiconductor layer;
   a source/drain extension area which is formed at a position adjacent to the channel area in the semiconductor layer in the first direction; and
   a source/drain area which is formed at a position adjacent to the source/drain extension area in the semiconductor layer in the first direction;
   wherein a width of the semiconductor layer in the channel area in the second direction is smaller than a width of the semiconductor layer in the source/drain extension area in the second direction.

2. The semiconductor device according to claim 1, wherein the width of the semiconductor layer in the channel area in the second direction is smaller than a gate length of the gate electrode.

3. The semiconductor device according to claim 1, wherein the width of the semiconductor layer in the source/drain extension area in the second direction is equal to or larger than a gate length of the gate electrode.

4. The semiconductor device according to claim 1, wherein the gate electrode is constituted by a first part which is formed on one side of the semiconductor layer in the second direction and a second part which is formed on the other side of the semiconductor layer in the second direction.

5. The semiconductor device according to claim 1, wherein the width of the semiconductor layer in the channel area in the second direction is smaller than a width of the semiconductor layer in the source/drain area in the second direction.

6. The semiconductor device according to claim 5, wherein the width of the semiconductor layer in the source/drain extension area in the second direction is smaller than the width of the semiconductor layer in the source/drain area in the second direction.

7. The semiconductor device according to claim 5, wherein the width of the semiconductor layer in the source/drain extension area in the second direction is equal to the width of the semiconductor layer in the source/drain area in the second direction.

8. A semiconductor device comprising:
a semiconductor substrate;
a plurality of fin-shaped first semiconductor layers which are formed on the semiconductor substrate, long in a first direction, short in a second direction crossing the first direction, and aligned in the second direction;
a second semiconductor layer which connects a plurality of the first semiconductor layers with each other at end portions of a plurality of the first semiconductor layers in the first direction;
a gate insulating layer which is formed on side surfaces of each of a plurality of the first semiconductor layers in the second direction;
a gate electrode arranged so as to be adjacent to the gate insulating layer;
a channel area which is formed at a position adjacent to the gate insulating layer in a plurality of the first semiconductor layers;
a source/drain extension area formed at a position adjacent to the channel area in the first direction in a plurality of the first semiconductor layers; and
a source/drain area formed at a position adjacent to the source/drain extension area in the second semiconductor layer in the first direction;
wherein a width of each of a plurality of the first semiconductor layers in the channel area in the second direction is smaller than a width of each of a plurality of the first semiconductor layers in the source/drain extension area in the second direction.

9. The semiconductor device according to claim 8, wherein heights of a plurality of the first semiconductor layers are all equal to each other.

10. The semiconductor device according to claim 8, wherein the inside of the second semiconductor layer all consists of the source/drain area.

11. The semiconductor device according to claim 8, wherein the width of the first semiconductor layer in the source/drain extension area in the second direction is smaller than a width of the second semiconductor layer in the source/drain area in the second direction.

12. The semiconductor device according to claim 8, wherein the width of the first semiconductor layer in the channel area in the second direction is smaller than a gate length of the gate electrode.

13. A semiconductor device comprising:
a semiconductor substrate;
a fin-shaped semiconductor layer which is formed on the semiconductor substrate, is long in a first direction and is short in a second direction crossing the first direction;
a gate insulating layer formed on side surfaces of the semiconductor layer in the second direction;
a gate electrode arranged so as to be adjacent to the gate insulating layer;
a channel area formed at a position adjacent to the gate insulating layer in the semiconductor layer;
a source/drain extension area formed at a position adjacent to the channel area in the semiconductor layer in the first direction;
a source/drain area formed at a position adjacent to the source/drain extension area in the semiconductor layer in the first direction; and
a silicide layer which is formed on a surface portion of the semiconductor layer in the source/drain layer but not formed in the inner portion of the same;
wherein a width of each of a plurality of the first semiconductor layers in the channel area in the second direction is smaller than a width of each of a plurality of the first semiconductor layers in the source/drain extension area in the second direction.

14. The semiconductor device according to claim 13, wherein a width of the semiconductor layer in the second direction is double-larger than a width of the silicide layer in the second direction which is formed on the surface portion of the semiconductor layer in the second direction.

15. The semiconductor device according to claim 13, wherein a width of the semiconductor layer in the source/drain area in the second direction is larger than a width of the semiconductor layer in the source/drain extension area or the channel area in the second direction.

16. The semiconductor device according to claim 13, wherein a height of the semiconductor layer in the source/drain area is larger than a height of the semiconductor layer in the source/drain extension area or the channel area.

17. The semiconductor device according to claim 13, further comprising:
a sidewall insulating layer which covers a plurality of the first semiconductor layers to a boundary between the first and second semiconductor layers; and
a silicide layer which is formed by siliciding the second semiconductor layer,
wherein the semiconductor layer has a square shape, and a width from an angular portion of a first semiconductor layer placed at a farthest end among a plurality of the first semiconductor layers to an angular portion of the second semiconductor layer is set larger than a thickness of the silicide layer.

18. The semiconductor device according to claim 17, wherein the silicide layer does not reach the first semiconductor layer placed at the farthest end among a plurality of the first semiconductor layers.

19. The semiconductor device according to claim 13, wherein the silicide layer is formed on an upper portion of the semiconductor layer and a surface portion of the same in the second direction.

20. The semiconductor device according to claim 19, wherein an insulating layer which functions as a stopper in silicidation is formed between the silicide layer on the upper portion of the semiconductor layer and the semiconductor layer.

* * * * *